United States Patent
Miyazawa et al.

(10) Patent No.: US 6,856,131 B2
(45) Date of Patent: Feb. 15, 2005

(54) MAGNETIC SENSOR, SIDE-OPENED TEM CELL, AND APPARATUS USING SUCH MAGNETIC SENSOR AND SIDE-OPENED TEM CELL

(75) Inventors: Yasunori Miyazawa, Sendai (JP); Katsuji Kaminishi, Sendai (JP); Masahiro Yamaguchi, Sendai (JP); Kenichi Arai, Shiogama (JP)

(73) Assignee: Ryowa Electronics Co., Ltd., Miyagi-ken (JP)

( * ) Notice: Subject to any disclaimer, the term of this patent is extended or adjusted under 35 U.S.C. 154(b) by 155 days.

(21) Appl. No.: 10/355,092

(22) Filed: Jan. 31, 2003

(65) Prior Publication Data

US 2004/0021463 A1 Feb. 5, 2004

(30) Foreign Application Priority Data

Aug. 1, 2002 (JP) ....................................... 2002-225436

(51) Int. Cl.[7] ............................................... G01R 33/02
(52) U.S. Cl. ....................................... 324/252; 324/260
(58) Field of Search ................................ 324/250, 252, 324/260; 439/55, 63; 361/784, 803, 816; 333/33, 260

(56) References Cited

U.S. PATENT DOCUMENTS 3,201,721 A * 8/1965 Voelcker ...................... 333/33

4,930,215 A * 6/1990 Roche et al. .................. 29/830
5,532,659 A * 7/1996 Dodart ........................ 333/260

FOREIGN PATENT DOCUMENTS

| EP | 347316 A2 * 12/1989 | ............. H01P/1/04 |
| EP | 1154512 A2 * 11/2001 | ............. H01P/5/08 |
| JP | 3085651 | 7/2000 |

OTHER PUBLICATIONS

Note: An English language abstract of the above Japanese citation is provided to serve as a partial translation.
Copending U.S. Appl. No. 10/373,067, filed Feb. 26, 2003, by Yasunori Miyazawa et al.

* cited by examiner

Primary Examiner—Bot LeDynh
(74) Attorney, Agent, or Firm—Paul A. Guss

(57) ABSTRACT

A magnetic sensor has a monotonic response to high-frequency magnetic strengths in a frequency range up to superhigh frequencies. The magnetic sensor includes a shielded loop coil having a triplate stripline structure. The shielded loop coil has one-turn looped ground patterns formed respectively in a first layer and a fifth layer and connected parallel to each other by a via, and has an inductance L. The one-turn looped ground patterns have end electrodes facing each other across gaps, one of the end electrodes including the via, providing a combined capacitor operable at high frequencies and having a capacitance C. The product L×C of the inductance L and the capacitance C is $2.5 \times 10^{-20}$ or less and the maximum outer circumference length of the one-turn looped ground lines is 50 [mm] or less.

9 Claims, 32 Drawing Sheets

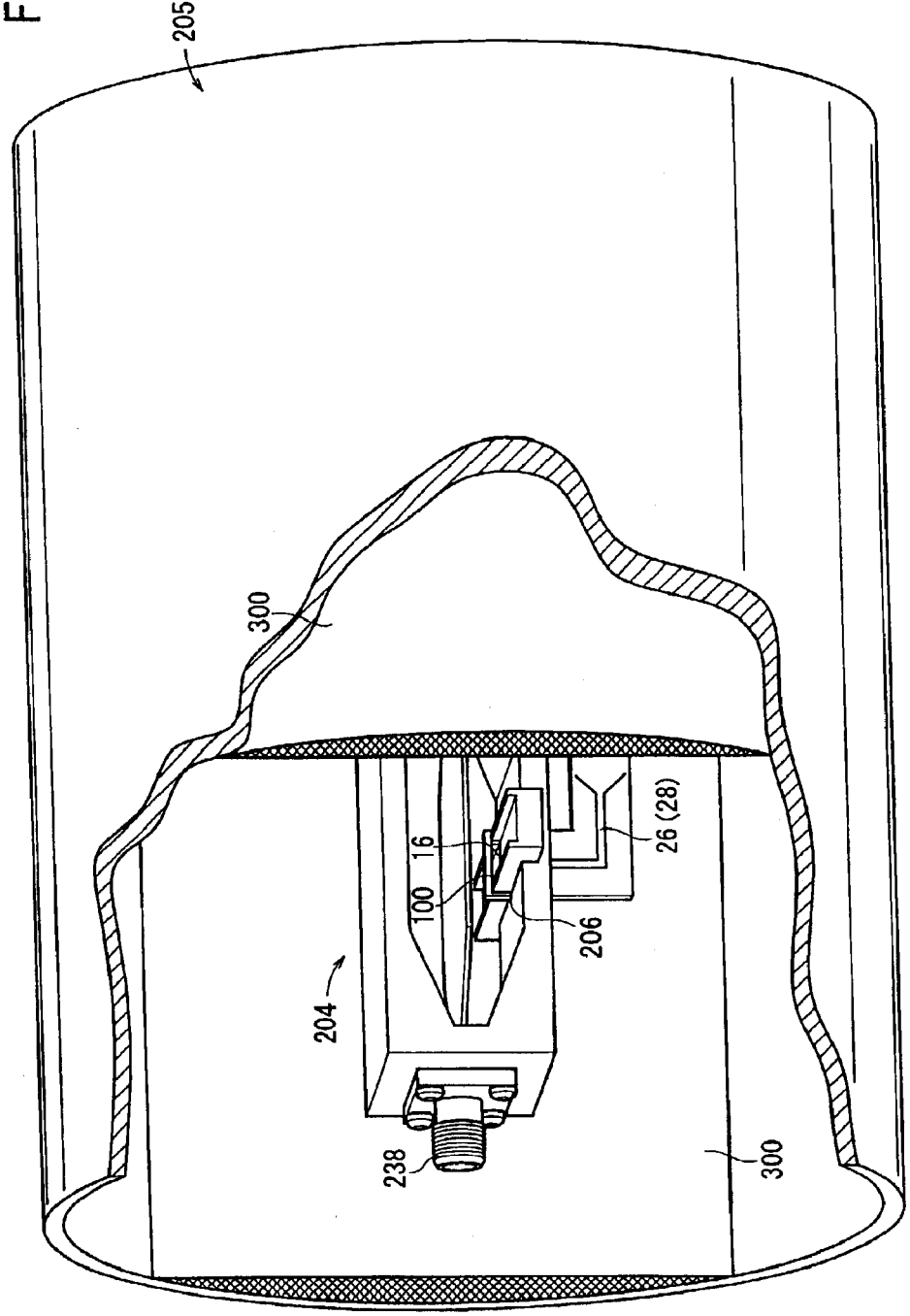

MAGNETIC SENSOR, SIDE-OPENED TEM CELL, AND APPARATUS USING SUCH MAGNETIC SENSOR AND SIDE-OPENED TEM CELL

BACKGROUND OF THE INVENTION

1. Field of the Invention

The present invention relates to a magnetic sensor which serves as a magnetic field pick-up coil having a monotonic response to magnetic field strength over a wide frequency range from low to superhigh frequencies, a side-opened TEM (Transverse ElectroMagnetic) cell suitable for use in an apparatus for generating a spatially uniform and directional high-frequency electromagnetic field, and a permeameter using such a magnetic sensor and a side-opened TEM cell.

2. Description of the Related Art

The recent rapid advances in IT (Information Technology) accelerate the development of high-speed information and communication instruments as an infrastructural basis for IT. Many developed information and communication instruments have an ability to process signals in frequency ranges up to a GHz frequency range. These high-speed information and communication instruments incorporate many kinds of high-frequency electromagnetic devices including ICs (Integrated Circuits) as indispensable elements.

Magnetic materials, in particular, among various materials related to high-frequency devices will be discussed below. There is a growing demand for soft-magnetic thin films which exhibit desired frequency characteristics in the GHz frequency range. For example, soft-magnetic thin films which show a large magnetization change in a small magnetic field, for use in RF (Radio Frequency) integrated inductors or the like, are desirable, and radio wave absorbers for electromagnetic noise reduction are in need of high-loss magnetic materials having a permeability whose imaginary part has a large value.

For developing these magnetic materials responsive to a high-frequency, it is necessary to have an apparatus capable of accurately measuring a complex permeability in a high frequency range which serves as a reference for material evaluation. Some of the inventors of the present invention devised a permeameter with a standing wave type cavity of a doublet structure whose terminal end is short-circuited, for measuring a complex permeability in a frequency range up to 2 through 3 GHz, and a magnetic sensor (i.e., a shielded loop coil type magnetic sensor having a triplate stripline structure) which is a key device in the permeameter with the standing wave type cavity. These-devices have already been patented as Japanese patent No. 3085651.

There are approved standards for wireless LAN (Local Area Network) for use in a 5 GHz frequency range to meet demands for broadband internet, and many chip sets and products according to such wireless LAN standards have been placed into the market recently. In the field of optical communication technology, an increasing tendency has arisen to shift 10 GHz optical communication modules into an inexpensive general-purpose device market, and efforts to standardize 10 GBE (Giga-Byte Ethernet) are in a final stage.

In view of an explosive increase of devices which handle signals whose fundamental frequencies exceed 5 GHz, attempts to develop superhigh-frequency magnetic materials having high-frequency characteristics up to about 10 GHz have been activated. Permeameters which are highly accurate and can be handled with ease are also required to operate in an increased range of frequencies up to about 10 GHz.

It is important to take into account EMC (ElectroMagnetic Compatibility) in the superhigh-frequency range for using the above devices. For quantitative EMC measurement, highly sensitive magnetic sensors capable of accurately measuring high-frequency magnetic fields are much in demand. In order to accurately measure the frequency response of a magnetic sensor or measure the permeability of a magnetic material, there is also required an electromagnetic field generating apparatus for applying a known spatially uniform and directional high-frequency electromagnetic field to the device or specimen in a frequency range up to about 10 GHz.

The greatest problem which has heretofore prevented magnetic sensors from being designed and used at higher frequencies is that although shielded-loop coil type magnetic sensors are recognized in principle as being excellent for operation at higher frequencies, their accurate electric model has not been established, ideally correct behaviors of their frequency response have been unknown, and it has not been clear as to which part of the magnetic sensor practically governs limitations of their frequency characteristics.

Specifically, while a physical analysis of shielded-loop coil type magnetic sensors has not been known, the magnetic sensors have been invented according to a cut-and-try application of the fabrication technology for printed circuit boards or for multilayer ceramic boards, through technical analogy of a magnetic sensor coil made from a semirigid coaxial cable.

A review of conventional shielded-loop coil type magnetic sensors which have actually succeeded in high-frequency applications indicates that rectangular sensors having a longer side of about 10 mm are operable in a high-frequency range up to about 1 GHz, and such sensors are improved on a trial-and-error basis or reduced in shape to dimensions of about several mm or less for operation in a high-frequency range up to about 3 GHz.

However, serious develop difficulties will come up if above empirical efforts are made to develop shielded-loop coil type magnetic sensors for higher performance without clarifying the physical principles of operation thereof.

Another reason why magnetic sensors or materials operable at higher frequencies cannot be realized is that there have not been available means for generating a high-frequency magnetic field whose spatial strength is constant and whose magnetic field directions are parallel to each other. In the above permeameter with the standing wave type cavity, a standing mode wave is built in the cavity, whose size limits the maximum usable frequency up to 2 through 3 GHz. A TEM wave mode propagated through a coaxial transmission line and a pseudo-TEM wave mode transmitted through the doublet cavity are quite different from each other. Therefore, a connector between the doublet cavity and the coaxial transmission cable causes a large mode conversion loss, making it difficult to convert high-frequency electric energy from an RF signal source efficiently into a high-frequency magnetic field.

TEM cells are used in the art as means for solving the above problem of the mode conversion loss and generating a uniform high-frequency electromagnetic field. However, the maximum usable frequency of conventional TEM cells is limited to about 1 GHz. In addition, the TEM cells have a cavity structure covered with its entire outer surface of a ground metal. Therefore, difficulties are encountered in introducing a specimen to be measured into and removing it from the cavity. For the above reasons, it has been difficult to apply TEM cells to permeameters.

SUMMARY OF THE INVENTION

It is therefore an object of the present invention to provide a magnetic sensor which will solve the above problems and accomplish the following tasks:

The first task is to provide a magnetic sensor capable of operating at frequencies several times higher than the conventional magnetic sensors insofar as possible under the physical limitations of the magnetic sensor.

The second task is to provide a magnetic sensor which is highly sensitive to frequencies and exhibits a quantitative frequency response.

The third task is to provide a magnetic sensor which can strictly suppress the entry of an error signal induced by an electric field and detect only a magnetic field strength.

The fourth task is to provide a magnetic sensor which is low in cost, provides a high yield in production, and can be manufactured with ease.

The fifth task is to provide a magnetic sensor which, as a result of the above features, can measure a permeability with higher accuracy at higher frequencies while reducing errors.

It is also an object of the present invention to provide a side-opened TEM cell for a high-frequency cavity and a permeameter which can use a magnetic sensor according to the present invention and accomplish the following tasks:

The first task is to provide a structure (side-opened TEM cell cavity) which has a cavity the interior of which can easily be accessed from outside the cavity, and which can generate a uniform high-frequency magnetic field (having a constant value everywhere and parallel magnetic force lines) regardless of the frequency in a certain spatial volume.

The second task is to provide a wide-band side-opened TEM cell cavity which has good impedance matching to 50Ω, suffers a small transmission loss, and has small frequency dependency of characteristics, and hence can generate an electromagnetic field close to an ideal TEM wave, and can be used as a high-frequency standard electromagnetic field source for use in various measurement applications.

The third task is to provide a cavity which either is structurally modified from ideal dimensions to compensate for an impedance shift caused by a load when the load is of a fixed value, and/or has an impedance compensator disposed within the cavity.

The fourth task is to realize the generation of a uniform high-frequency magnetic field that serves as a condition which is technically indispensable for the designing of a permeameter operable at higher frequencies.

According to the present invention, there is provided a magnetic sensor comprising a multilayer circuit board with a triplate stripline, the multilayer circuit board having a first surface conductor layer, a second surface conductor layer, and an inner conductor layer, the first surface conductor layer and the second surface conductor layer having respective one-turn looped ground patterns, and respective ground lead patterns connected respectively to the one-turn looped ground patterns, the one-turn looped ground patterns having respective gaps, the inner conductor layer having a substantially C-shaped signal line sandwiched between the one-turn looped ground patterns and serving as a central conductor of the stripline, and a signal lead line sandwiched between the ground lead patterns and serving as the central conductor of the stripline, the substantially C-shaped signal line extending across the gaps from one end to the other end, the substantially C-shaped signal line being connected through a via to the other end of the one-turn looped ground patterns. If the one-turn looped ground patterns have an inductance L and a capacitor composed between both electrodes provided by ends of the one-turn looped ground patterns which face each other across the gap, one of the ends including the via as an electrode, has a capacitance C, then the product L×C of the inductance L and the capacitance C is $2.5 \times 10^{-20}$ [Henry×Farad] or less and the maximum outer circumference length of the one-turn looped ground patterns is 50 [mm] or less.

The one-turn looped ground patterns are of a rectangular shape, a polygonal shape having five or more sides, a circular shape, or an elliptical shape. The gaps are positioned anywhere on the one-turn looped ground patterns opposite to the sides thereof from which the ground lead patterns of the output leads extend. For examples, the gaps are positioned in the central regions of the one-turn looped ground lines, or positioned in the upper sides thereof if the one-turn looped ground patterns are of a rectangular shape.

The above magnetic sensor offers various advantages. For example, the magnetic sensor is capable of operating at frequencies several times higher than the conventional magnetic sensors insofar as possible under the physical limitations of the magnetic sensor. The magnetic sensor is highly sensitive to frequencies and exhibits a quantitative frequency response. The magnetic sensor can strictly suppress the entry of an error signal induced by an electric field and detect only a magnetic field strength. The magnetic sensor is low in cost, provides a high yield in production, and can be manufactured with ease.

In the magnetic sensor, an opening hole extends through the multilayer circuit board and is positioned inside the one-turn looped ground lines. A permeameter which incorporates the magnetic sensor with a magnetic specimen inserted in the opening hole is capable of measuring permeability at a small error, with higher accuracy, and at higher frequencies.

The magnetic sensor further comprises a plurality of vias interconnecting the one-turn looped ground pattern of the first surface conductor layer and the one-turn looped ground pattern of the second surface conductor layer and/or the ground lead pattern of the first surface conductor layer and the ground lead pattern of the second surface conductor layer. With this arrangement, the generation of an unwanted mode is suppressed to make the high-frequency characteristics of the magnetic sensor as better as allowed by physical limitations of the magnetic sensor.

The magnetic sensor further comprises shielding ground conductor lines extending along the substantially C-shaped signal line of the inner conductor layer and connected to the vias, and shielding ground conductor lines extending along the signal lead line of the inner conductor layer and connected to the vias. The shielding ground conductor lines provide a higher shielding effect which allows the signal lines, and contribute to a width reduction of the ground patterns as a sensor coil physically.

According to the present invention, there is also provided a side-opened TEM cell comprising a high-frequency cavity ground body which comprises upper and lower ground electrodes and longitudinally opposite end ground electrodes which are machined from a conductor in the shape of a rectangular parallelepiped, leaving a cavity having a horizontally elongate octagonal cross-sectional shape with four corners beveled vertically from longitudinal sides thereof, first and second high-frequency coaxial connectors mounted centrally on the end ground electrodes and having respective central signal pins having respective confronting electrodes, a plate-shaped high-frequency signal electrode disposed between the confronting electrodes of the central pins parallel to the upper and lower ground electrodes, the high-frequency signal electrode comprising a plate in the shape of a horizontally elongate octagonal shape with four corners beveled, the plate having a width equal to or narrower than 0.7 times the width of the upper and lower ground electrodes, the high-frequency signal electrode and the upper and lower ground electrodes jointly making up a triplate transmission line between the first and second high-frequency coaxial connectors, the high-frequency signal electrode having attachment end faces joined to the central pins of the high-frequency coaxial connectors, the attachment end faces having a width equal to or narrower than three times the thickness of the high-frequency signal electrode to maintain the impedance of 50Ω over the full length of the triplate transmission line.

With the above arrangement, in a central region of the high-frequency cavity, an electric field is vertically directed from the plate-shaped high-frequency electrode toward the upper and lower ground electrodes, and a magnetic field is directed perpendicularly to the direction in which a high-frequency signal is propagated and the direction of the electric field, respectively i.e., parallel to the high-frequency signal electrode and the upper ground electrode and perpendicularly to the direction in which the high-frequency signal travels. In a certain spatial range, the electric and magnetic fields have a substantially constant intensity and are directed perpendicularly to each other.

According to the present invention, there is also provided a permeameter comprising a cavity of a parallel transmission line structure having an impedance of 50Ω for generating a high-frequency magnetic field therein parallel to the parallel transmission line structure and perpendicular to the transmission direction by applying a high-frequency signal to an end connector of the cavity, the cavity having an opposite end short-circuited or impedance-matched by a terminal resistor, a magnetic sensor, described above, which is placed in the high-frequency magnetic field with the slit opening being directed perpendicularly to the high-frequency magnetic field and the gap facing a high-frequency signal electrode of the parallel transmission line, the opening hole of the magnetic sensor accommodating a magnetic specimen horizontally inserted therein. An induced voltage of the magnetic sensor and an impedance of the magnetic sensor are measured when the magnetic specimen is magnetically saturated and unsaturated, for thereby measuring a complex permeability of the magnetic specimen.

The cavity of the parallel transmission line structure may be a triplate side-opened TEM cell. The triplate cavity with its other end short-circuited may be used in a permeameter with a standing wave mod field.

Alternatively, a triplate side-opened TEM cell with the second high-frequency coaxial connector being terminated with 50Ω may be used as the cavity of the parallel transmission line structure having the impedance of 50Ω. With the triplate side-opened TEM cell used, a highly uniform high-frequency electromagnetic field may be generated in a superwide frequency range.

A surface of the upper ground electrode which faces the high-frequency signal electrode is machined to expand an upper half space defined between the high-frequency signal electrode and the upper ground electrode to match the impedance of parts in a transmission direction of the side-opened TEM cell to 50Ω when the magnetic sensor is placed in a lower half space defined between the high-frequency signal electrode and the lower ground electrode. The permeameter thus arranged is effective to suppress the generation of an unwanted mode of electromagnetic wave, and can be used in a higher frequency range.

The lower ground electrode of the side-opened TEM cell has a slit opening defined therein and extending in a direction in which an electromagnetic wave travels, the slit opening accessing the part of the one-turn looped ground patterns inside the cell, which function as a magnetic sensor head, the one-turn looped ground patterns being inserted in the lower half space through the slit at such a position that a forward transmission coefficient from the cell to the magnetic sensor is of a value smaller than −10 dB. This arrangement makes it possible to keep a small spatial disturbance of the electromagnetic field in the cell. The whole opening hole of the shielded loop coil is present in the lower half space in the side-opened TEM cell. And also the lower side of the one-turn looped ground patterns should preferably be positioned in alignment with the just surface plane of the lower ground electrode, of the side-opened TEM cell or higher.

The permeameter further comprises a radio wave return suppressor disposed near the cavity for reflecting, interfering with, or absorbing a high-frequency electromagnetic wave which leaks from a side opening of the cavity of the parallel transmission line structure having the impedance of 50Ω. The radio wave return suppressor is able to reduce a power of a high-frequency electromagnetic wave reflected from a boundary outside the cavity into the cavity opening, or disturb a phase of a reflected wave, in order to suppress a resonant transverse mode. The radio wave suppressor may be a reflecting plate, an interference plate, or a radio wave absorber.

The above and other objects, features, and advantages of the present invention will become more apparent from the following description when taken in conjunction with the accompanying drawings in which preferred embodiments of the present invention are shown by way of illustrative example.

BRIEF DESCRIPTION OF THE DRAWINGS

FIG. 32 is a perspective view, partly broken away, of a permeameter having radio wave absorbers applied to side walls on a solenoid coil which surrounds a side-opened TEM cell.

DESCRIPTION OF THE PREFERRED EMBODIMENTS

Figure 1:
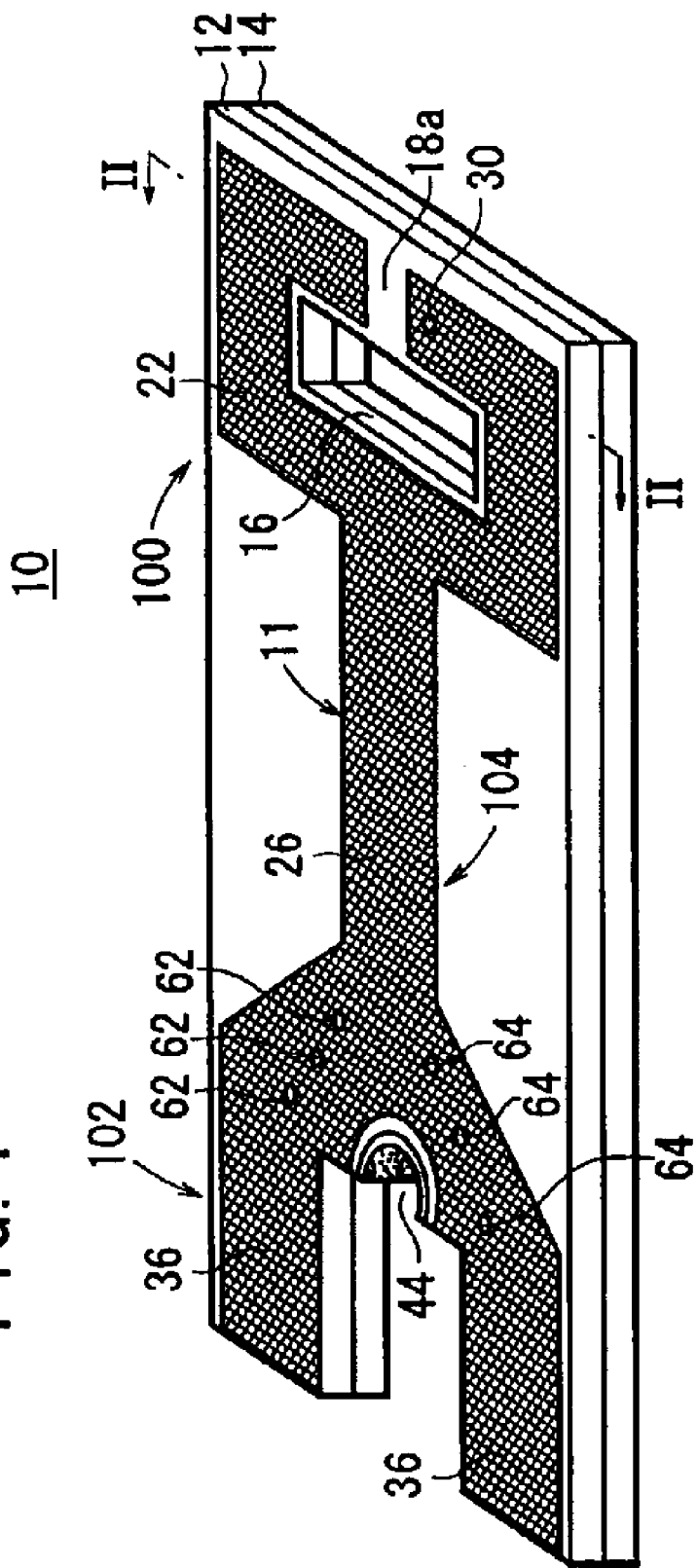
FIG. 1 is a perspective view of a magnetic sensor according to a first embodiment of the present invention.
Figure 2:
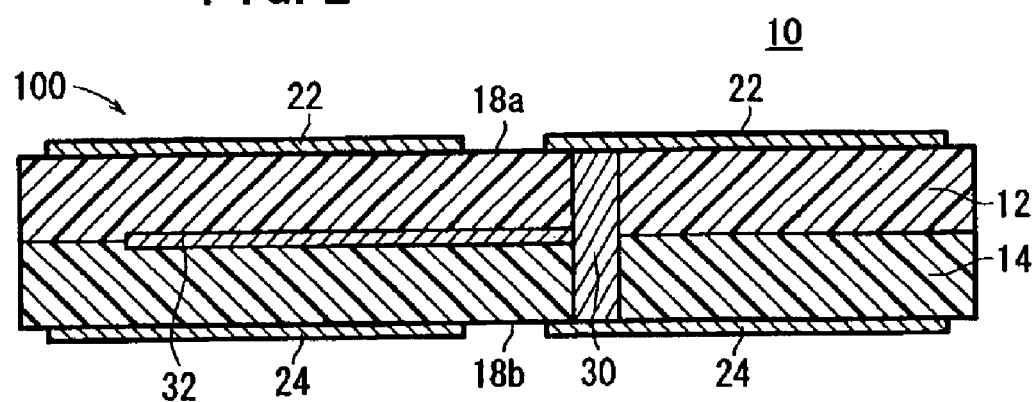
FIG. 2 is a cross-sectional view taken along line II—II of FIG. 1.
Figure 3:
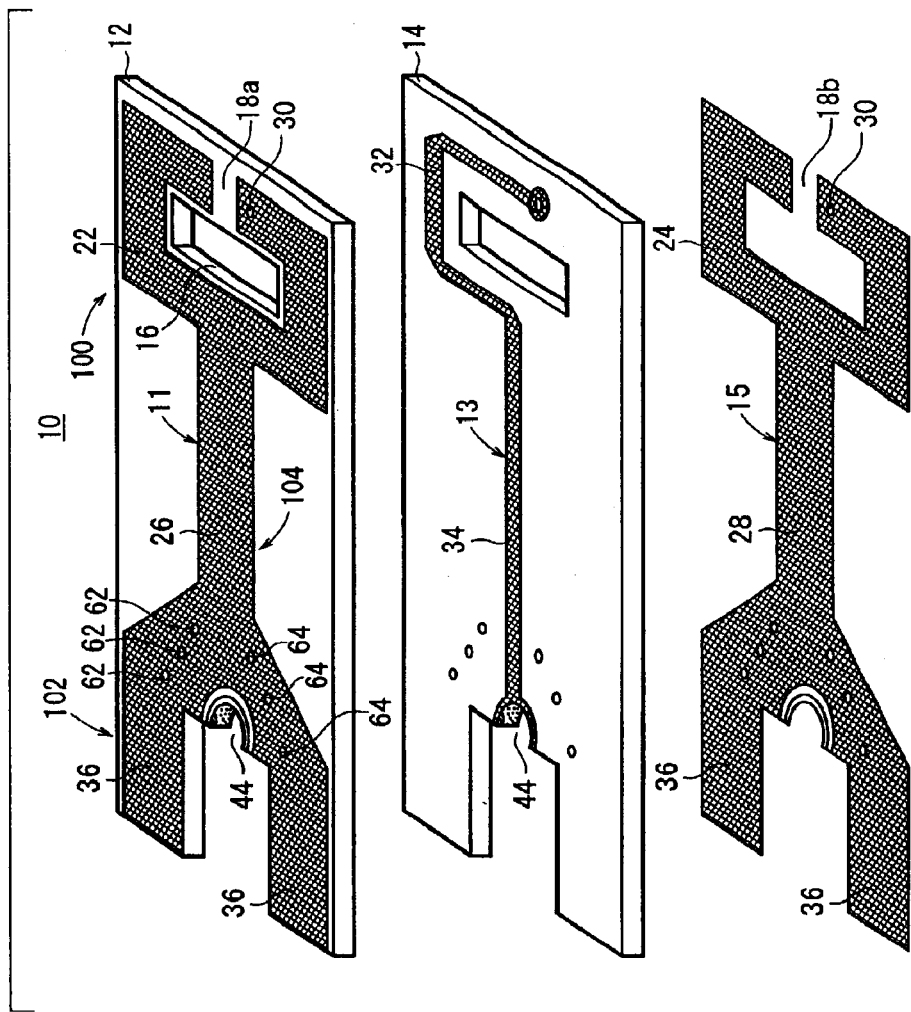
FIG. 3 is an exploded perspective view of the magnetic sensor shown in FIG. 1.
Figure 4:
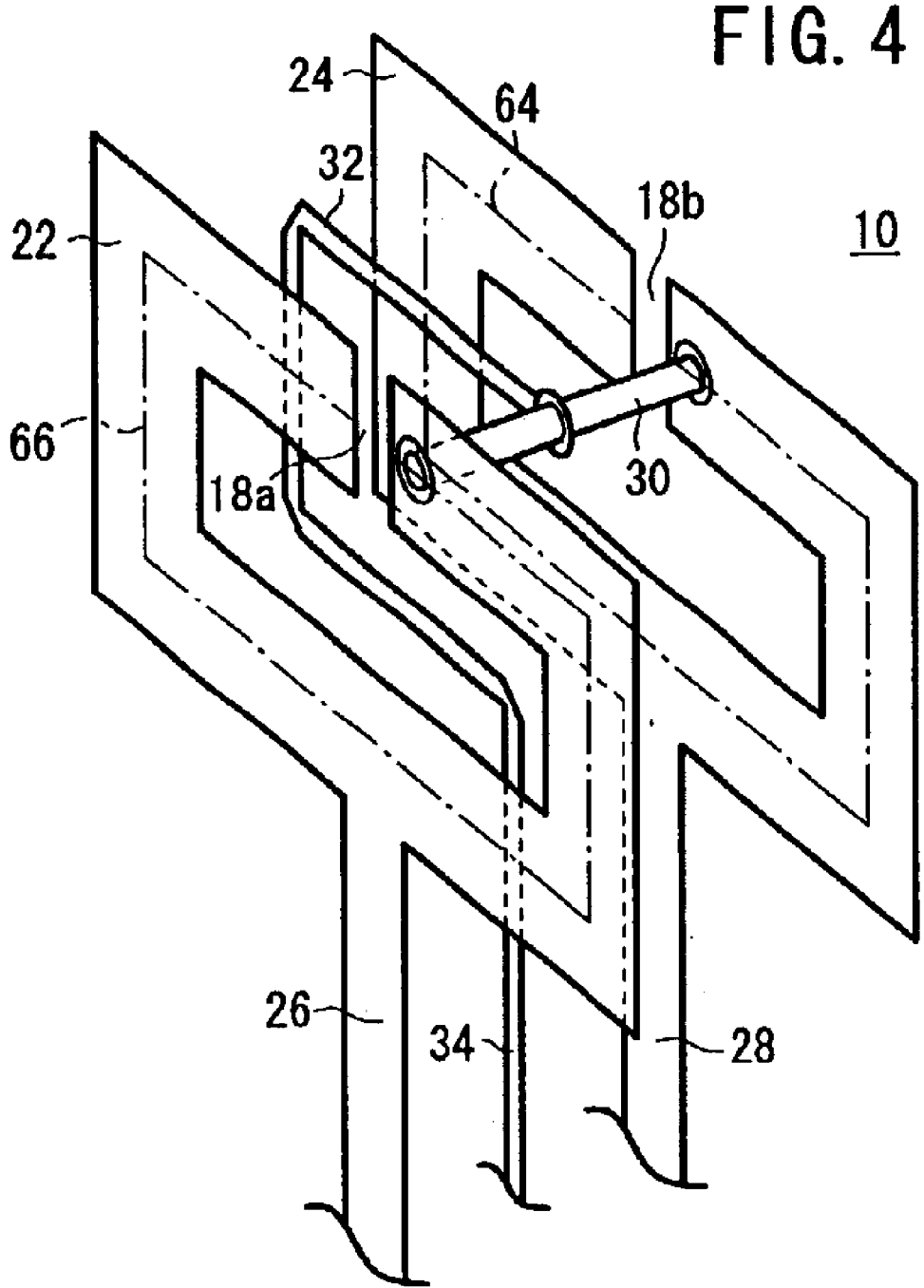
FIG. 4 is a fragmentary perspective view of conductor patterns of the magnetic sensor shown in FIG. 1.

FIG. 1 shows in perspective a magnetic sensor 10 according to a first embodiment of the present invention. FIG. 2 shows the magnetic sensor 10 in a cross section taken along line II—II of FIG. 1. FIG. 3 shows the magnetic sensor 10 in exploded perspective. FIG. 4 shows conductor patterns of the magnetic sensor 10 in fragmentary perspective.

As shown in FIG. 1, the magnetic sensor 10 basically comprises a shielded loop coil 100 which functions as a sensor for detecting a magnetic field strength, a high-frequency connection part 102 for connection to a coaxial line or the like to be described later on, and an output lead 104 connecting the shielded loop coil 100 and the high-frequency connection part 102 to each other.

As shown in FIGS. 1 through 4, the magnetic sensor 10 is constructed as a shielded loop coil type magnetic sensor having a triplate stripline structure which employs a five-layer printed circuit board. The five-layer printed circuit board comprises three conductor layers including a first layer (also referred to as a top conductor layer or a first surface conductor layer) 11, a third layer (also referred to as an inner conductor layer) 13, and a fifth layer (also referred to as a bottom conductor layer or a second surface conductor layer) 15, and two dielectric layers including a second layer (dielectric layer) 12 interposed between the first surface conductor layer 11 and the inner conductor layer 13 and a fourth layer (dielectric layer) 14 interposed between the inner conductor layer 13 and the second surface conductor layer 15.

According to the first embodiment, the dielectric layers 12, 14, which each have a thickness of 0.2 mm, are made of PPE (polyphenylene ether) which has smaller permittivity and frequency dispersion and better high-frequency characteristics than FR4 which has heretofore been used as a glass epoxy resin printed board material. The first and second surface conductor layers 11, 15, which each have a thickness of 18 $\mu$m, are made of Cu, and the inner conductor layer 13, which has a thickness of 35 $\mu$m, is also made of Cu.

The shielded loop coil type magnetic sensor 10 has an opening hole 16 defined in the shielded loop coil 100 and extending through the first through fifth layers 11, 12, 13, 14, 15.

The opening hole 16 is defined as a through hole for inserting therein a magnetic thin-film specimen whose complex permeability is to be measured. If the magnetic sensor 10 does not need such an opening hole for inserting therein a magnetic thin-film specimen, then no opening hole is required to be defined in the second and fourth dielectric layers 12, 14. Stated otherwise, a magnetic sensor according to the present invention may be of such a configuration which is free of the through opening hole 16.

Figure 5:
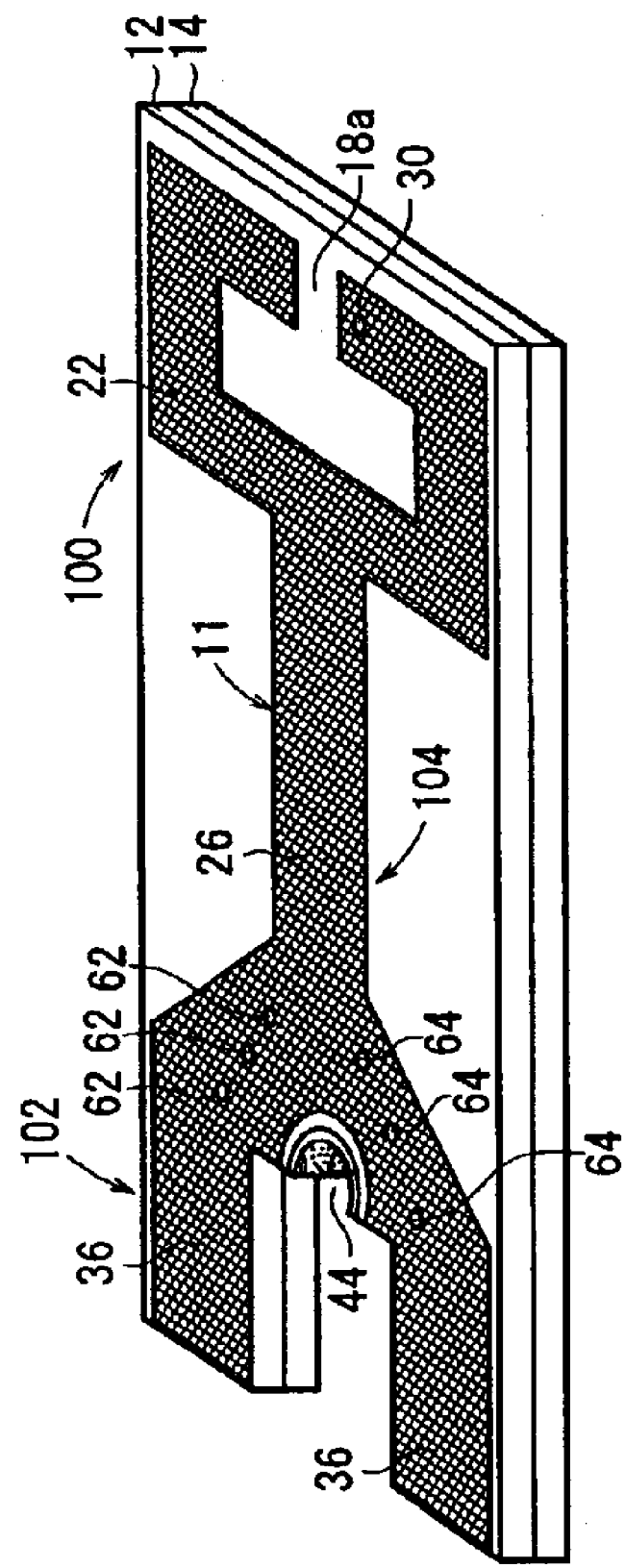
FIG. 5 is a perspective view of a magnetic sensor with no through opening defined therein according to a second embodiment of the present invention.

FIG. 5 shows in perspective a magnetic sensor 10A according to the present invention which is free of the through opening hole 16. The magnetic sensor 10A is substantially identical in structure to the magnetic sensor 10 according to the first embodiment shown in FIGS. 1 through 4 except that it has no opening hole 16.

According to the first embodiment shown in FIGS. 1 through 4, the shielded loop coil 100 includes looped ground patterns 22, 24, each comprising one turn, having respective gaps 18a, 18b defined in identical circumferential positions thereof. The looped ground patterns 22, 24 are part of the first surface conductor layer 11 and the second surface conductor layer 15, respectively, extending around the opening hole 16, and lying coextensively with each other across the second, third, and fourth layers 12, 13, 14.

The output lead 104 includes ground lead patterns 26, 28 extending outwardly from respective central areas of the looped ground patterns 22, 24 toward the high-frequency connector 102. The ground lead patterns 26, 28 are also part of the first surface conductor layer 11 and the second surface conductor layer 15, respectively.

The ground lead patterns 26, 28 have ends connected to the central areas of the looped ground patterns 22, 24 and opposite ends connected to respective U-shaped ground patterns 36 of the high-frequency connection part 102 for connection to a coaxial line 40 (see FIG. 6) with an impedance of 50Ω. The U-shaped ground patterns 36 are part of the first surface conductor layer 11 and the second surface conductor layer 15, respectively, and have a pattern which is progressively wider in a direction away from the ground lead patterns 26, 28. Each of the U-shaped ground patterns 36 is basically of a sleeve shape having two parallel spaced arms and a substantially arcuate joint interconnecting ends of the arms. According to the first embodiment, three vias 62 and three vias 64 are formed in the five-layer printed circuit board between the first surface conductor layer 11 and the second surface conductor layer 15 at positions along edges of the substantially arcuate joints of the U-shaped ground lines 36. The three vias 62 and three vias 64 are positioned symmetrically with respect to the longitudinal axis of the magnetic sensor 10, i.e., the direction in which the ground lead lines 26, 28 extend.

The inner conductor layer 13 includes a looped signal line 32 comprising a substantially one-half turn, which is shaped as a substantially C-shaped signal line having a less than one turn. The substantially C-shaped signal line 32 has an end connected by a via 30 to the ends of the looped ground patterns 22, 24 of the first surface conductor layer 11 and the second surface conductor layer 15 near the gaps 18a, 18b, and extends across the gaps 18a, 18b and further between opposite side parts of the looped ground patterns 22, 24. The via 30 extends through the layers 12, 13, 14.

The other end of the substantially C-shaped signal line 32 is connected to an end of a signal lead line 34 of the output lead 104 which extends between the confronting ground lead patterns 26, 28 that extend outwardly from the looped ground patterns 22, 24. The substantially C-shaped signal line 32 with the patterns 22, 24 and the signal lead line 34 with the patterns 26,28 jointly make up a continuous stripline.

Figure 6:
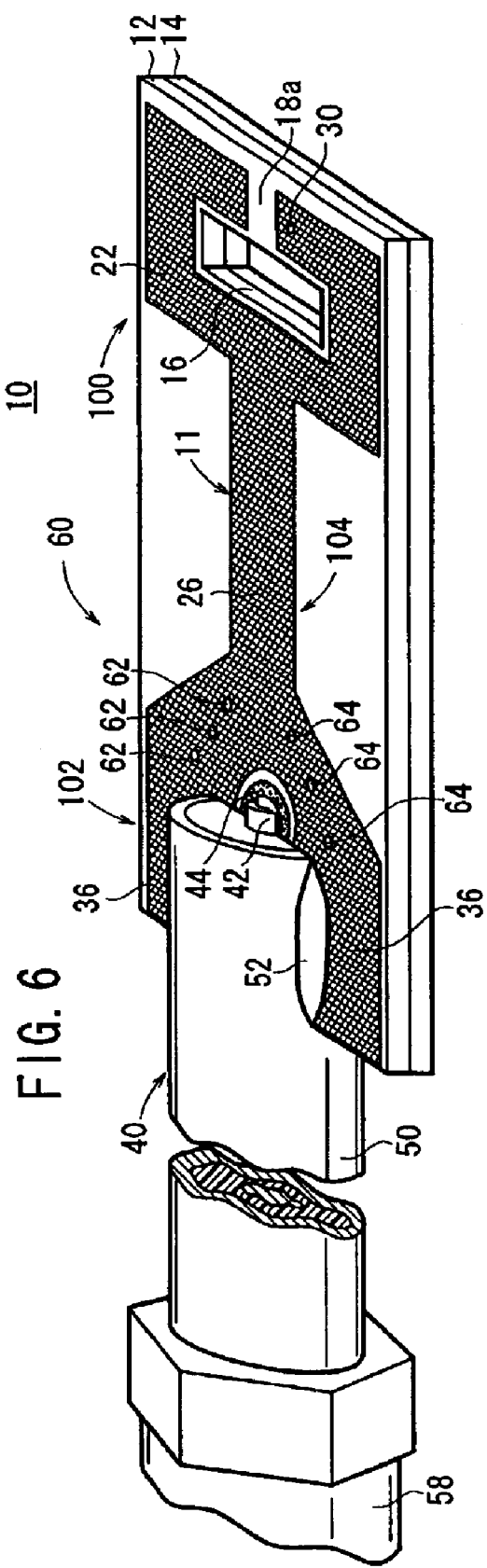
FIG. 6 is a fragmentary perspective view of a magnetic sensor assembly.

The other end of the signal lead line 34 is connected to a recessed via 44 which is connected by soldering, gluing, or the like to a signal line electrode 42 of the coaxial line 40 as shown in FIG. 6. The recessed via 44 is formed in the five-layer printed circuit board at a central position in the U-shaped ground lines 36.

The coaxial line 40 comprises a semirigid cable which has an impedance of 50Ω. The semirigid cable has an outer conductor 50 in the form of a pipe of Cu, a dielectric layer of polytetrafluoroethylene disposed in the outer conductor 50, and a central conductor as the signal line electrode 42 which comprises a rigid wire or twisted wires of Cu.

A high-frequency interconnection between the coaxial line 40 and the strip line, a high-frequency connection part 102, is made up by connecting the recessed via 44 and the sleeve-shaped ground patterns 36 with a small loss and good impedance matching. The high-frequency interconnection structure can easily provide an impedance of 50±1Ω across the joint between the coaxial line 40 and the recessed via 44 and the sleeve-shaped ground patterns 36. Details of the high-frequency interconnection structures are proposed in Japanese patent application No. 2002-56400 by some of the inventors of the present invention.

In the high-frequency interconnection structure, the outer conductor 50 at one end of the coaxial line 40 is inserted into the space between the sleeve-shaped ground lines 36, and then joined to the sleeve-shaped ground lines 36 by solder alloys 52 preferably at four locations, i.e., upper and lower spots on both sides of the outer conductor 50. The signal line electrode (central core) 42 is also soldered or glued to the recessed via 44.

The other end of the coaxial line 40 is connected to an SMA coaxial connector 58. The magnetic sensor 10, 10A (also magnetic sensor 10B through 10G to be described later on) which is connected to the coaxial line 40 and the coaxial connector 58 is referred to as a magnetic sensor assembly 60.

An electrical macro model which is properly descriptive of behaviors of the physical characteristics over a full frequency range of the shielded loop coil type magnetic sensor 10 which is an important feature of the present invention will be described below. In the magnetic sensor 10 according to the first embodiment of the present invention, the shielded loop coil 100 includes, as shown in FIG. 3, the opening hole 16, the one-turn looped ground patterns 22, 24 having the respective gaps 18a, 18b, the substantially C-shaped signal line 32 electrically connected to the looped ground patterns 22, 24 by the via 30, and the dielectric layers 12, 14 where the opening hole 16, the gaps 18a, 18b, the looped ground patterns 22, 24, and the substantially C-shaped signal line 32 are formed as a pattern.

Figure 7:
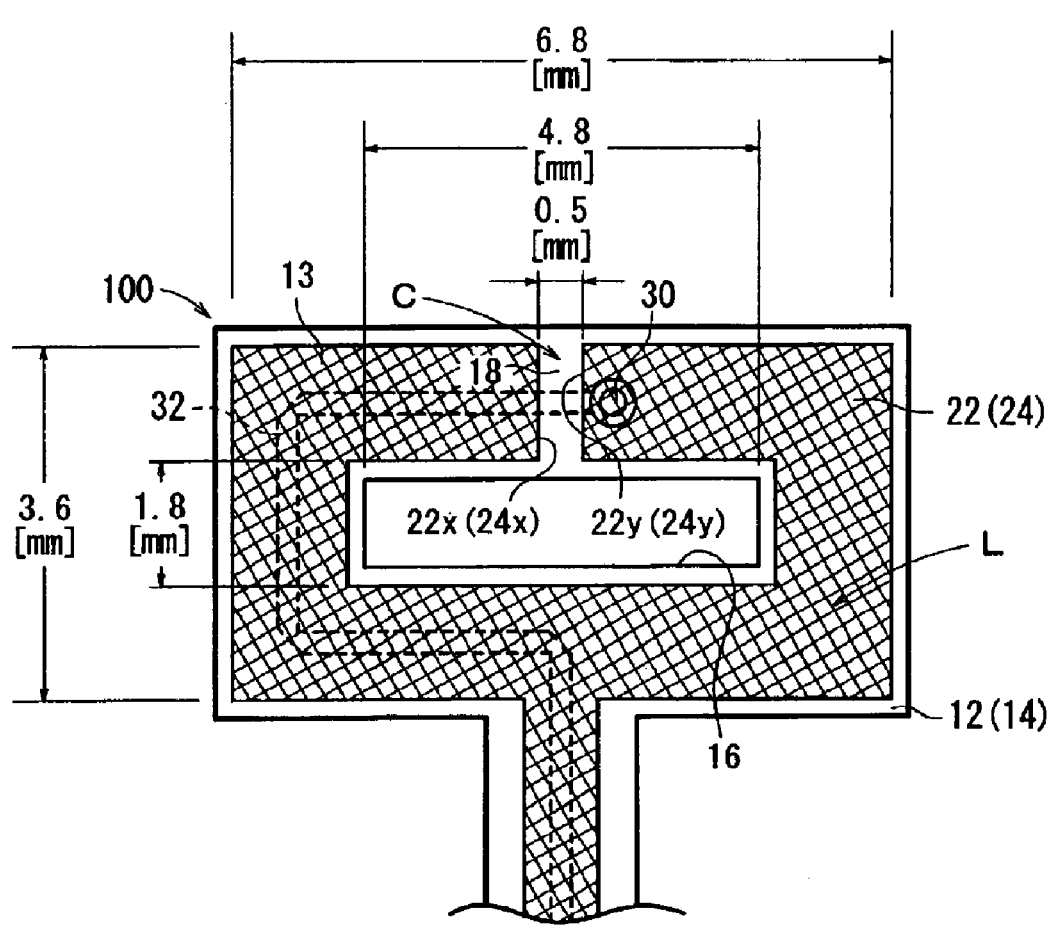
FIG. 7 is a front view showing a shielded loop coil and its dimensions.

FIG. 7 schematically shows the shielded loop coil 100, to which an end of the output lead 104 is connected, of a prototype product of the magnetic sensor 10 which is capable of responding to frequencies higher than 10 GHz. As shown in FIG. 7, the shielded loop coil 100 has a rectangular outer profile of 3.6 mm×6.8 mm (having an (maximum) outer circumference length of 20.8 mm), and a rectangular inner profile of 1.8 mm×4.8 mm (having an inner circumference length of 13.2 mm). The shielded loop coil 100 also has a gap 18 (18a, 18b), which is 0.5 mm wide, defined in an upper region thereof.

The looped ground patterns 22, 24 of the first surface conductor layer 11 and the second surface conductor layer 15 serve as ground electrodes, and each has a thickness of 18 μm. The substantially C-shaped signal line 32 of the inner conductor layer 13 serves as a signal electrode, and has a thickness of 35 μm. The substantially C-shaped signal line 32 and the looped ground patterns 22, 24 jointly make up a triplate stripline having an impedance of 50Ω, which is connected to the output lead 104.

The conductors of the looped ground patterns 22, 24 serve as one-turn loop coils for acting on an external magnetic field which is applied perpendicularly to the sheet of FIG. 7. When the looped ground patterns 22, 24 are placed in such an external magnetic field, an electromotive force is induced across the gap 18 defined in the upper region of the shielded loop coil 100 according to Faraday's law.

If the looped ground patterns 22, 24 connected parallel to each other by the first surface conductor layer 11 and the second surface conductor layer 15 are regarded as a one-turn coil, the value of its inductance L is uniquely determined depending on the physical shape and size of the coil patterns.

Across the gap 18, which is 0.5 mm wide, defined in the upper region of the shielded loop coil 100, there is formed a capacitance C which is a combination of the capacitor between confronting electrode ends 22x, 22y of the looped ground pattern 22 and confronting electrode ends 24x, 24y of the looped ground pattern 24, and the capacitor between the looped ground patterns 22, 24 near the electrode ends 22x, 22y, 24x, 24y, i.e., a combined capacitance C formed to operate at high frequencies between end electrodes of the looped ground patterns 22, 24 that face each other across the gaps 18a, 18b, one of the end electrodes including the via 30. The overall capacitance C is formed to operate at high frequencies between the electrodes facing each other across the gap 18. The value of the overall capacitance C is uniquely determined depending on the physical shape and size of the coil electrode patterns.

The looped ground patterns 22, 24 and the substantially C-shaped signal line 32 are connected to each other by the via 30 that is positioned rightward of the gap 18 in FIG. 7. A voltage induced across the gap 18 when the shielded loop coil 100 is placed in an external magnetic field is transmitted through a combined impedance of the inductance L and the capacitance C connected parallel thereto to the substantically C-shaped signal line 32 and then outputted from the output lead 104 both of which serves as a transmission line having an impedance of 50Ω. Specifically, if the shielded loop coil 100 which functions as a loop antenna is regarded as a magnetic sensor device, then the induced voltage is transmitted through the stripline made up of the looped ground patterns 22, 24 and the substantially C-shaped signal line 32 in the device and then through the stripline of the output lead 104, and outputted from the device. Finally, the voltage is detected in a good impedance match condition with the impedance of 50Ω of the transmission line. Specifically, the voltage is sent from the output lead 104 through the connector 102 and the coaxial line 40 to a terminator having an impedance of 50Ω, and detected as a voltage between the terminals of the terminator.

Figure 8:
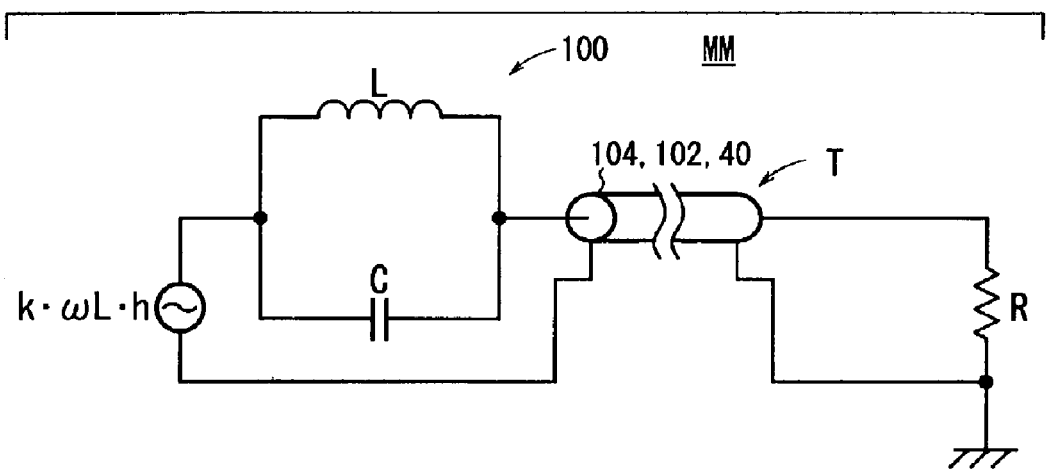
FIG. 8 is a diagram showing a macro model of the shielded loop coil.

FIG. 8 shows an electrical macro model MM which is accurately representative of the above operation of the shielded loop coil 100 and the transmission line connected thereto. When the shielded loop coil 100 is placed in a high-frequency magnetic field h [A/m] which is uniformly distributed with a constant amplitude and has an angular frequency ω [rad/sec] in a space where the shielded loop coil 100 is present, a voltage k·ωL·h is induced across the gap 18 where k represents a field conversion coefficient into an induced voltage for the inductance L.

Figure 9:
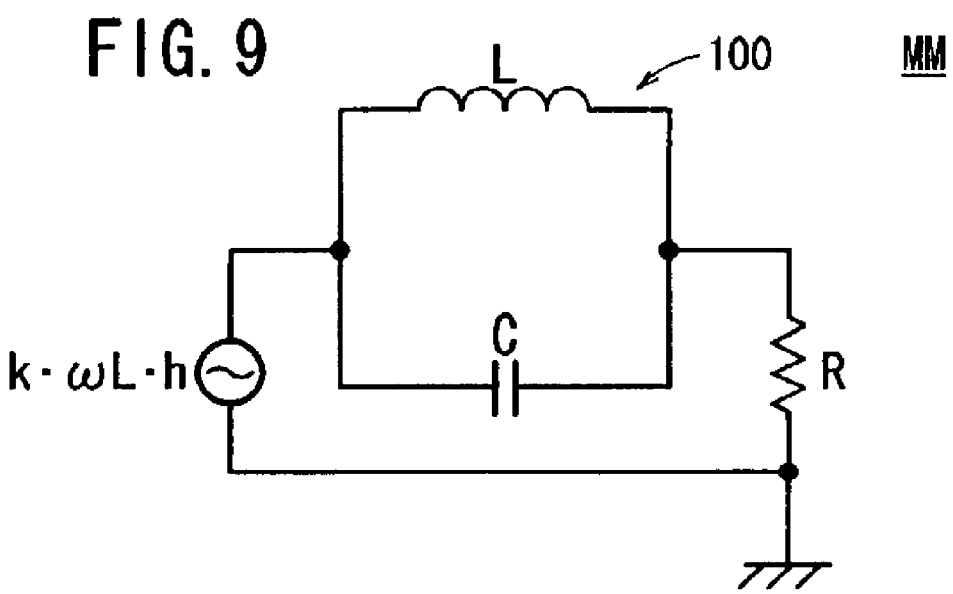
FIG. 9 is a diagram showing a simplified macro model of the shielded loop coil equivalent to FIG. 8.

If an induced voltage is transmitted through the strip lines in the device of the magnetic sensor 10 and an ideal 50Ω transmission line T and detected with complete impedance matching, then the electrical macro model MM shown in FIG. 8 can be simplified into an equivalent electrical macro model MM shown in FIG. 9.

If the combined impedance of the inductance L and the capacitance C is represented by Zs, then the detected voltage V generated across a terminal resistor having a resistance R=50Ω is expressed by the following equation (1):

$$V = k \cdot \omega L \cdot h \times R/(Zs + R) \quad (1)$$
$$= k \cdot \omega L \cdot h \times 50/(Zs + 50)$$
$$= 50(1 - \omega^2 CL)k\omega Lh/\{j\omega L + 50(1 - \omega^2 CL)\}$$

For example, the equation (1) is calculated on the assumption that the combined capacitance C is $C=3.0\times10^{-15}$ [F]=3 [fF] and the inductance L is $L=3.9\times10^{-9}$ [H]=3.9 [nH].

Figure 10:
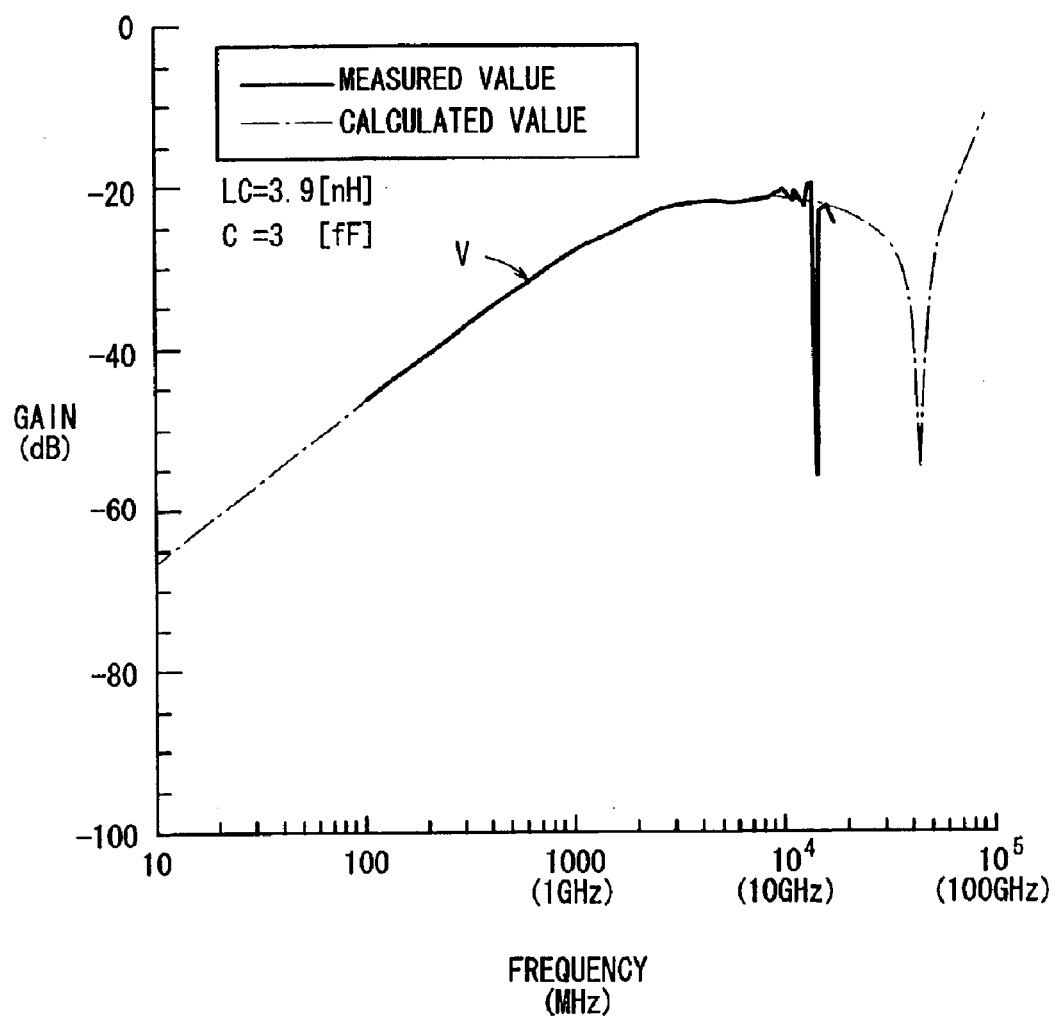
FIG. 10 is frequency gain curves of a detected voltage showing calculated values (indicated by the dot-and-dash-line) from the model and measured values (indicated by the solid-line) of a forward transmission coefficient S21.

FIG. 10 shows frequency gain curves of the detected voltage V by the magnetic sensor 10 based on calculated values (indicated by the dot-and-dash-line) and measured values (indicated by the solid-line) of a forward transmission coefficient S21 of an S parameter according to a vector network analyzer. It can be confirmed in FIG. 10 that the measured values (indicated by the solid-line curve) which represent observed values and the calculated values (indicated by the dot-and-dash-line curve) which represent predicted values according to the equation (1) are well in coincident with each other at all frequencies from the frequency of 100 MHz to the frequency of 9 GHz.

The values of the capacitance C and the inductance L were close to the values which had been derived by a simulation software which analyzes the Maxwell's equations using a finite element method. When the product ωL is much smaller than 50Ω, the detected voltage V is represented by k·ωL·h and has its gain increased in proportion to the frequency, exhibiting such characteristics that the shielded loop coil 100 is regarded purely as a coil (in the example shown in FIG. 10, the characteristics from low frequencies nearly to 1 [GHz]).

When the product ωL is much greater than 50Ω, the detected voltage V is represented by 50·k·h and does not depend on the frequency, and exhibits a constant gain (from around 4 GHz to around 10 GHz. As $\omega^2 CL$ approaches unity (1) at higher frequencies, the gain is gradually lowered.

As shown in FIG. 10, when the resonant frequency (represented by fp) of the parallel-connected circuit of the capacitance C and the inductance L is simply calculated, then fp=46 GHz. According to the measured values, a sharp gain drop due to resonance is observed at about 15 GHz which is lower than the calculated value.

A wavelength in a free space at the frequency of 15 GHz (referred to as a notch frequency fn) is checked. The wavelength is substantially the same as the (maximum) outer circumference length (20.8 mm) of the shielded loop coil 100 shown in FIG. 7. This wavelength is a phenomenally reasonable value as it corresponds to the physical length of the shielded loop coil 100 between the low-impedance voltage source of kωLh and the output lead 104.

In the example shown in FIG. 7, the shielded loop coil 100 is of a relatively large physical size. Regardless of the relatively large physical size, however, the shielded loop coil 100 exhibits excellent frequency characteristics in excess of 9 GHz, and it has been found that the (maximum) outer circumference length of the coil limits the highest frequency because the resonant frequency fp of the parallel-connected LC circuit is a higher frequency.

For much higher frequency characteristics, the coil may be reduced in size, removing limitations on the maximum outer circumference length of the coil.

In the above embodiments, printed circuit board manufacturing technology is used. However, a shielded loop coil having sides each 1 mm or less long can be produced with use of ceramics forming technology or Si semiconductor process by photo-lithography, for example. While the inductance L can be reduced in proportion to the physical size, the capacitance C cannot simply be reduced, with the resonant frequency fp limiting the maximum frequency of the coil.

In the above description, the electrical macro model MM of the magnetic sensor 10 composed of the shielded loop coil 100 is established and the physical characteristics have been clarified. It is also clear what factors limit a better high-frequency response of the magnetic sensor with such an ideal MM model.

Figure 11:
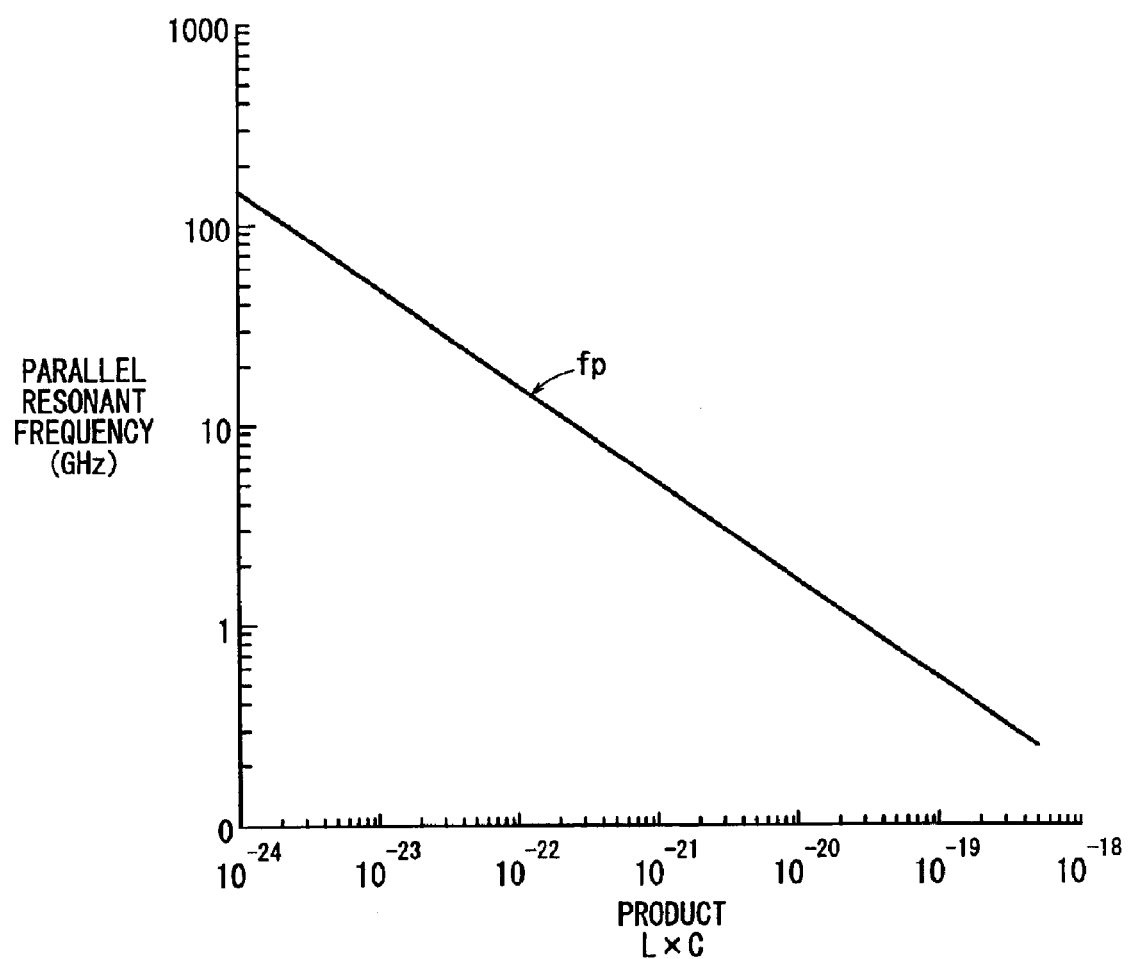
FIG. 11 is a diagram showing the relationship between a parallel resonant frequency and a product L×C.

The magnetic sensor 10 including the triplate stripline structure according to the first embodiment with the LC resonant frequency fp≧1 [GHz], and also a notch frequency fn≧6 [GHz] has better characteristics than magnetic sensors that are operable on other principles in a high frequency range. In view of the above features, if the inductance provided by the parallel-connected one-turn looped ground patterns 22, 24 of the first surface conductor layer 11 and the second surface conductor layer 15 is represented by L, and the overall capacitance C, operable at high frequencies, between the electrodes across the gaps 18a, 18b of the one-half turns of the looped ground patterns 22, 24 is represented by C, then it is preferable that the product L×C of the inductance L and the capacitance C be L×C=2.5×10⁻²⁰ or less and the maximum outer circumference length of the one-turn looped ground patterns 22, 24 be 50 [mm] or less. FIG. 11 shows the relationship between the parallel resonant frequency fp and the product L×C.

The one-turn looped ground patterns 22, 24 are of a rectangular shape, a polygonal shape having five or more sides, a circular shape, or an elliptical shape. The gaps 18a, 18b are positioned anywhere in sides of the one-turn looped ground patterns 22, 24 opposites to the sides thereof from which the ground lead patterns 26, 28 of the output leads 104 extend. For examples, the gaps 18a, 18b are positioned in the central areas of the one-turn looped ground patterns 22, 24 as shown in FIG. 1, or positioned in the upper sides thereof if the one-turn looped ground patterns 22, 24 are of a rectangular shape as shown in FIG. 7.

The magnetic sensor 10 according to the first embodiment will further be described below.

As shown in FIG. 3, the substantially C-shaped signal line 32 and the straight signal lead line 34 of the inner conductor layer 13 are designed with their corners beveled to provide an impedance 50Ω depending on the line width and the corner characteristics. The high-frequency connector 102 for connection to the coaxial line 40 is designed according to the technique (see FIG. 6) disclosed in Japanese patent application No. 2002-56400 and machined according to a managed board producing process. As a result, the magnetic sensor 10 can propagate a signal over a line whose impedance is controlled at 50±0.5Ω. For example, the magnetic sensor 10 is connected to a detector (not shown) connected to a second port of a network analyzer and terminated for no signal reflection with its impedance matching the impedance (50Ω) of the transmission line.

Heretofore, it has not been sufficiently recognized that when a signal generated by a shielded loop coil is propagated to the detector, a reflection which is generated at an impedance irregularity point on the transmission line and a reflection which is generated at a coil junction (where the via 30 is formed) that acts physically as a short-circuiting terminal end cause multiple interferences, which generate many large and small unwanted parasitic resonances, with the result that the gain is strongly modulated, imposing limitations on the frequency range of the magnetic sensor.

With the impedance controlled at 50±0.5Ω as described above according to the above embodiments, no signal modulations occur on the transmission line, and the theoretically predicted characteristics of an ideal one-turn loop coil (one-turn coil) are observed as actual results. It has been found that any impedance error should preferably be limited to ±5Ω or less, which depend on how much sensor gain error should be permitted.

In addition to those involved in impedance errors, it has heretofore been considered that on the assumption of a pure coil, it would be ideal for the voltage gain to increase in proportion to the frequency, and such characteristics which tend to saturate the gain are recognized as a high-frequency limit. However, since the configuration of the magnetic sensor 10 can be fabricated with good reproducibility according to photolithography, the above frequency sensitivity characteristics can be reproduced within 1 dB.

The looped ground patterns 22, 24 serving as a one-turn loop coil should preferably have as small a pattern width as possible in order not to disturb a magnetic field to be detected. On the other hand, the looped ground patterns 22, 24 should be as wide as possible from the standpoint of equalizing the impedance of the strip line composed of the looped ground patterns 22, 24 and the substantically C-sharped signal line 32 to a design value of 50Ω and keep a shield capability for a high-frequency electromagnetic field.

Practically, the pattern width of the looped ground patterns 22, 24 and the ground lead patterns 26, 28 may be at most eight times and at least twice the line width of the substantially C-shaped signal line 32 and the signal lead line 34 for good results.

It has experimentally been confirmed that, as shown in FIG. 4, the flux density of a magnetic field that is actually detected which lies within a range enclosed by central lines 64, 66 of the respective looped ground patterns 22, 24, which serve as a coil having a finite line width, contributes to the induced voltage V. The area within the central lines 64, 66 is referred to as an effective coil area.

Figure 12:
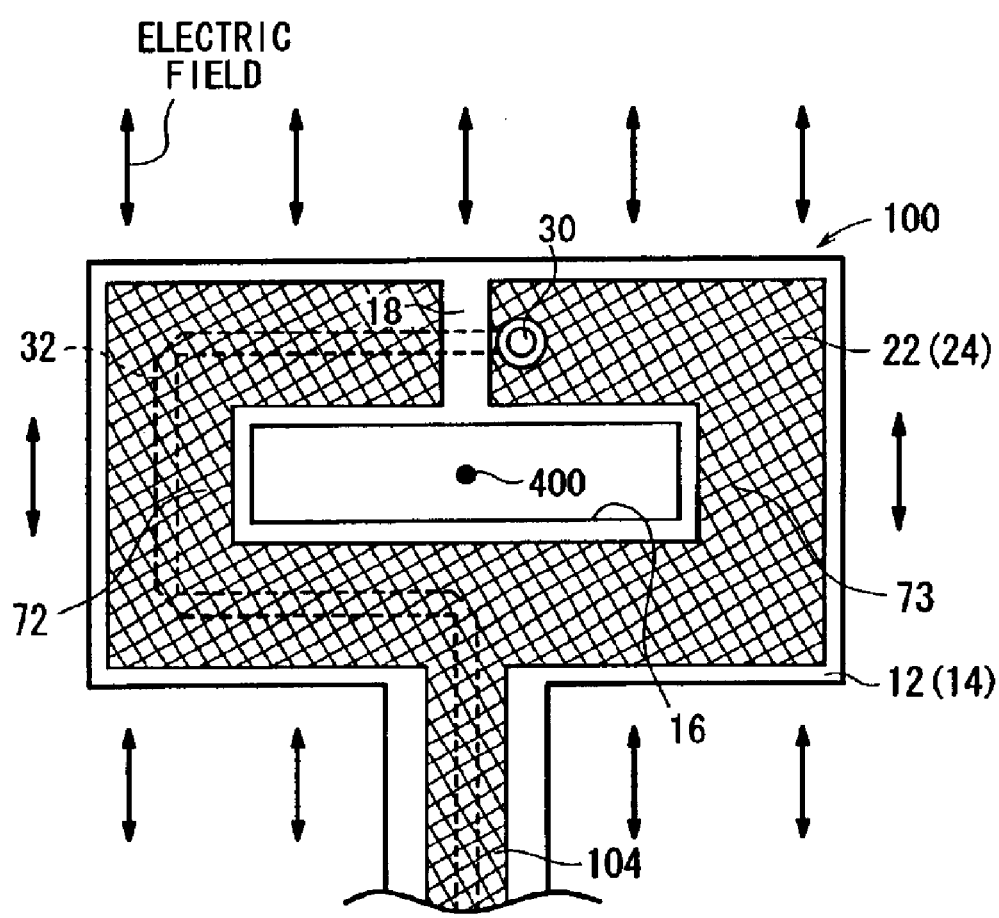
FIG. 12 is a view showing the relationship between a shielded loop coil and an external electric field.

As shown in FIG. 12, since the shielded loop coil 100 with the gap 18 positioned centrally in its upper region according to the first embodiment is electrically of a horizontally symmetrical shape, a current or voltage signal generated in a left electrode portion 72 and a current or voltage signal generated in a right electrode portion 73 have the same value and opposite polarities. The left and right electrode portions 72, 73 act as a monopole antenna by a high-frequency electric field which is indicated by double-headed arrows. Therefore, the signals induced by the high-frequency electric field and superposed on the magnetic field signal propagated through the striplines cancel each other, so that any error contained in the output signal transmitted to the output lead 104 due to the electric field signal is minimized. As a result, only the magnitude of a magnetic field component in an electromagnetic field in a traveling-wave mode can selectively be measured accurately up to superhigh frequencies. Even if the electric structure of the shielded loop coil 100 is not strictly balanced in its horizontally symmetrical shape, since the frequency response of the unbalanced electric field signal by the shielded loop coil 100 is proportional to the square of the frequency, any signal whose frequency is lower than the frequency which is about the same as the magnetic field signal is greatly decreased, so that any error contained in the output signal is practically negligible.

The above characteristics contribute definitely to the greater accuracy and wider frequency range of a permeameter to be described later on.

Figure 13:
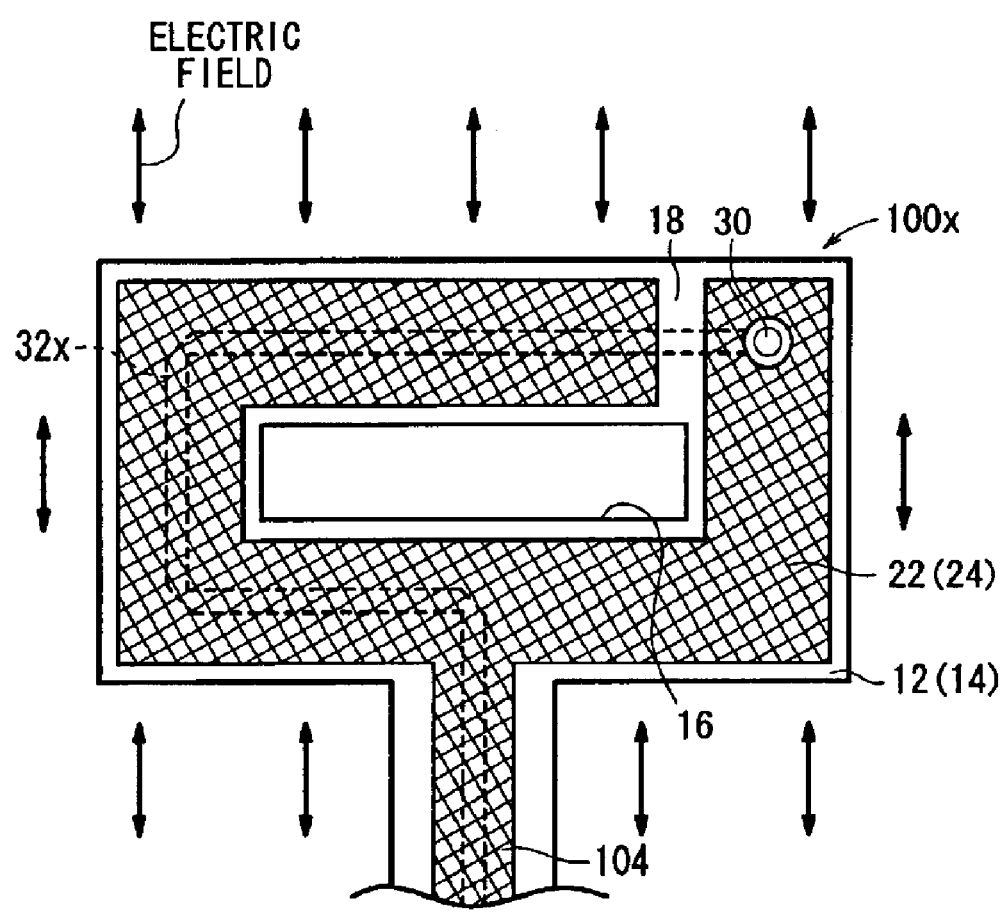
FIG. 13 is a view showing a shielded loop coil with a gap positioned in a longitudinal end thereof.
Figure 14:
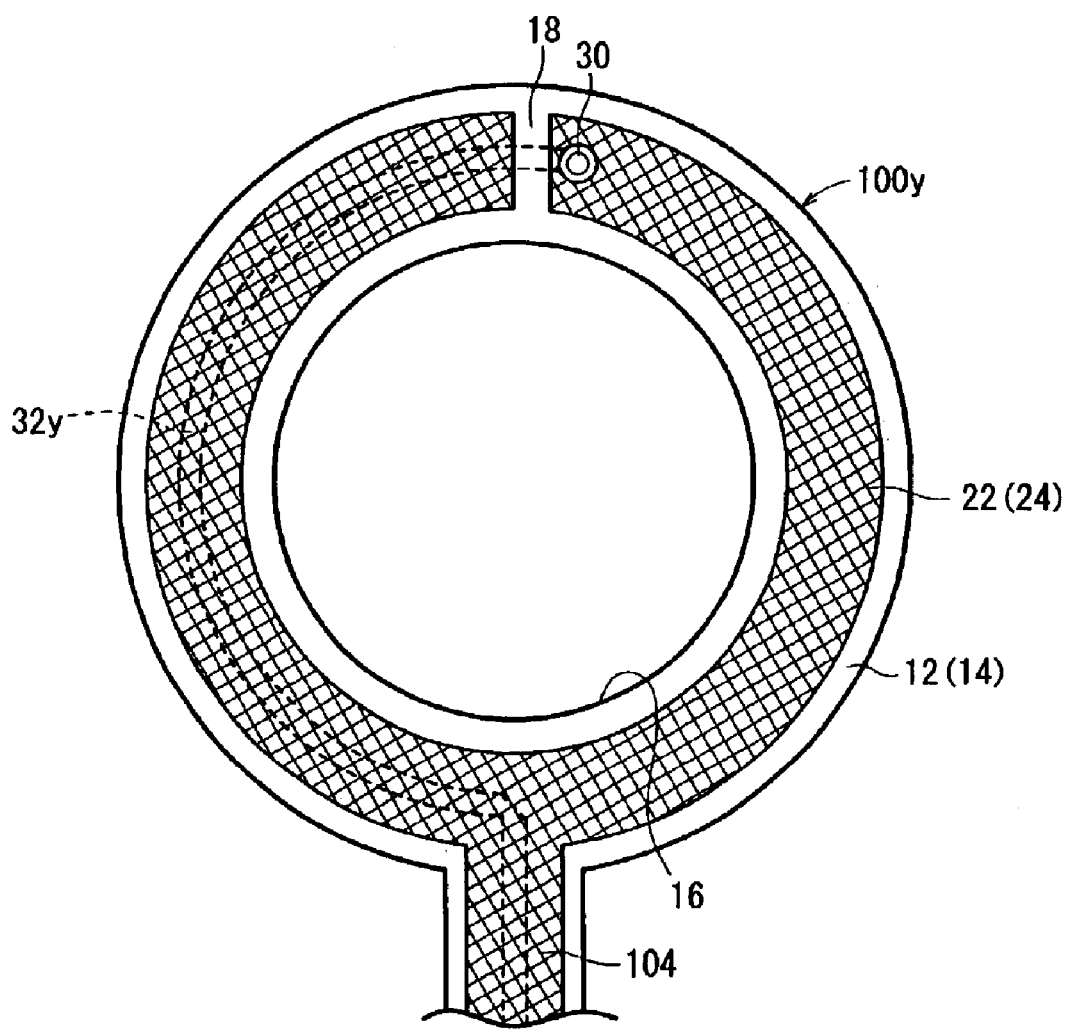
FIG. 14 is a view showing a circular shielded loop coil.
Figure 15:
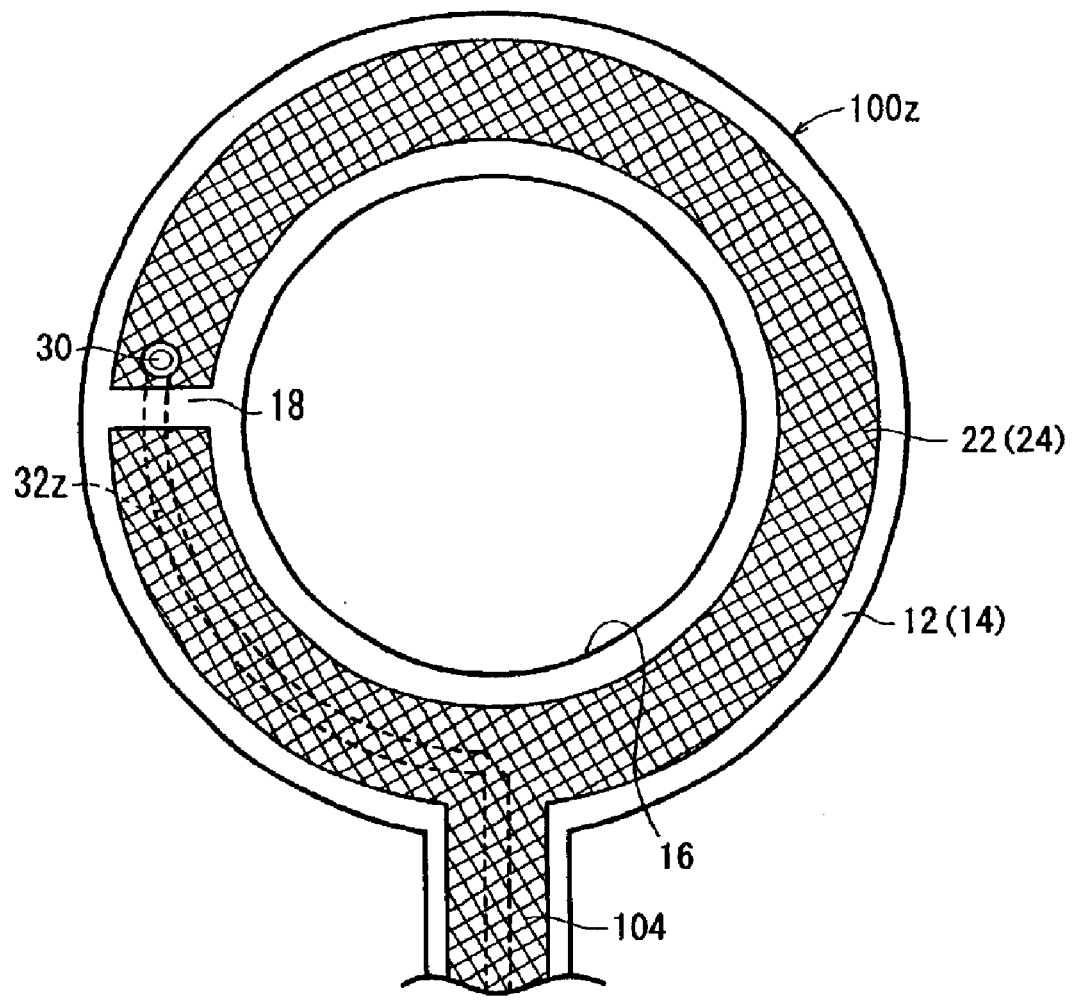
FIG. 15 is a view showing a circular shielded loop coil with a gap positioned in a lateral side thereof.

In FIGS. 1 and 12, the looped ground patterns 22, 24 of the shielded loop coil 100 is of a mirror symmetrical shape with respect to the longitudinal axis of the magnetic sensor 10. However, as shown in FIG. 13, a shielded loop coil 100x may have a gap 18 disposed in an end of a longitudinal side thereof. Alternatively, as shown in FIG. 14, a shielded loop coil 100y may have a circular shape. Further alternatively, as shown in FIG. 15, a circular shielded loop coil 100z may have a gap 18 positioned in a lateral side thereof. In FIG. 13, the signal line 32 comprises a signal line 32x having a substantially two-thirds turn. In FIG. 15, the signal line 32 comprises a signal line 32z having a substantially one-fourth turn.

Figure 16:
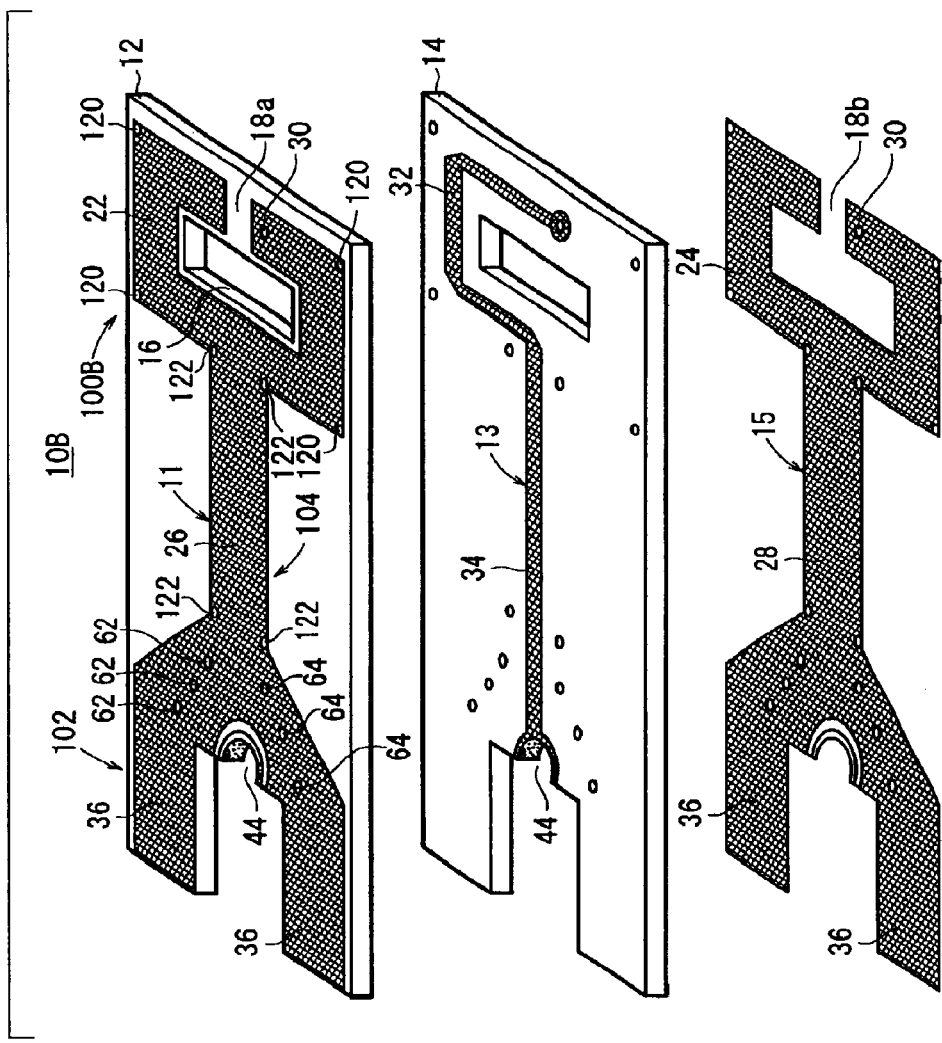
FIG. 16 is an exploded perspective view of a magnetic sensor according to a third embodiment of the present invention.
Figure 17:
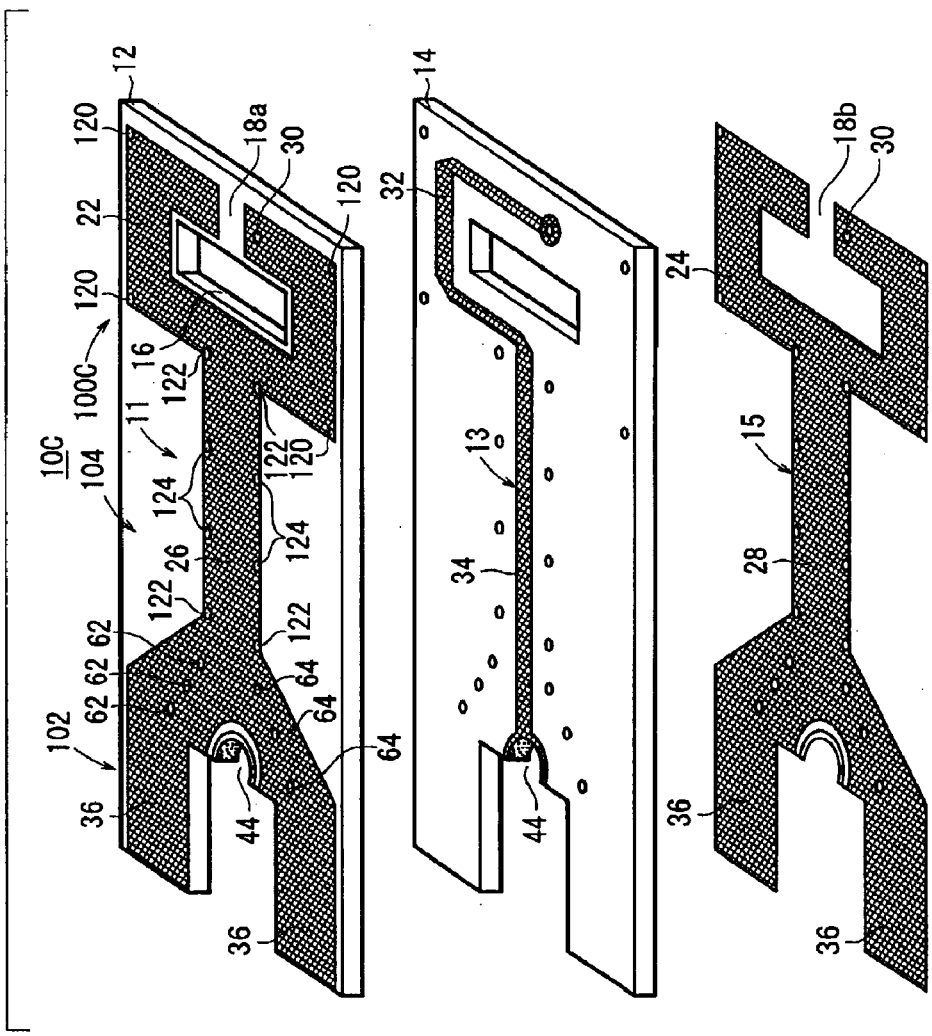
FIG. 17 is an exploded perspective view of a magnetic sensor (with a via pattern 1) according to a fourth embodiment of the present invention.
Figure 18:
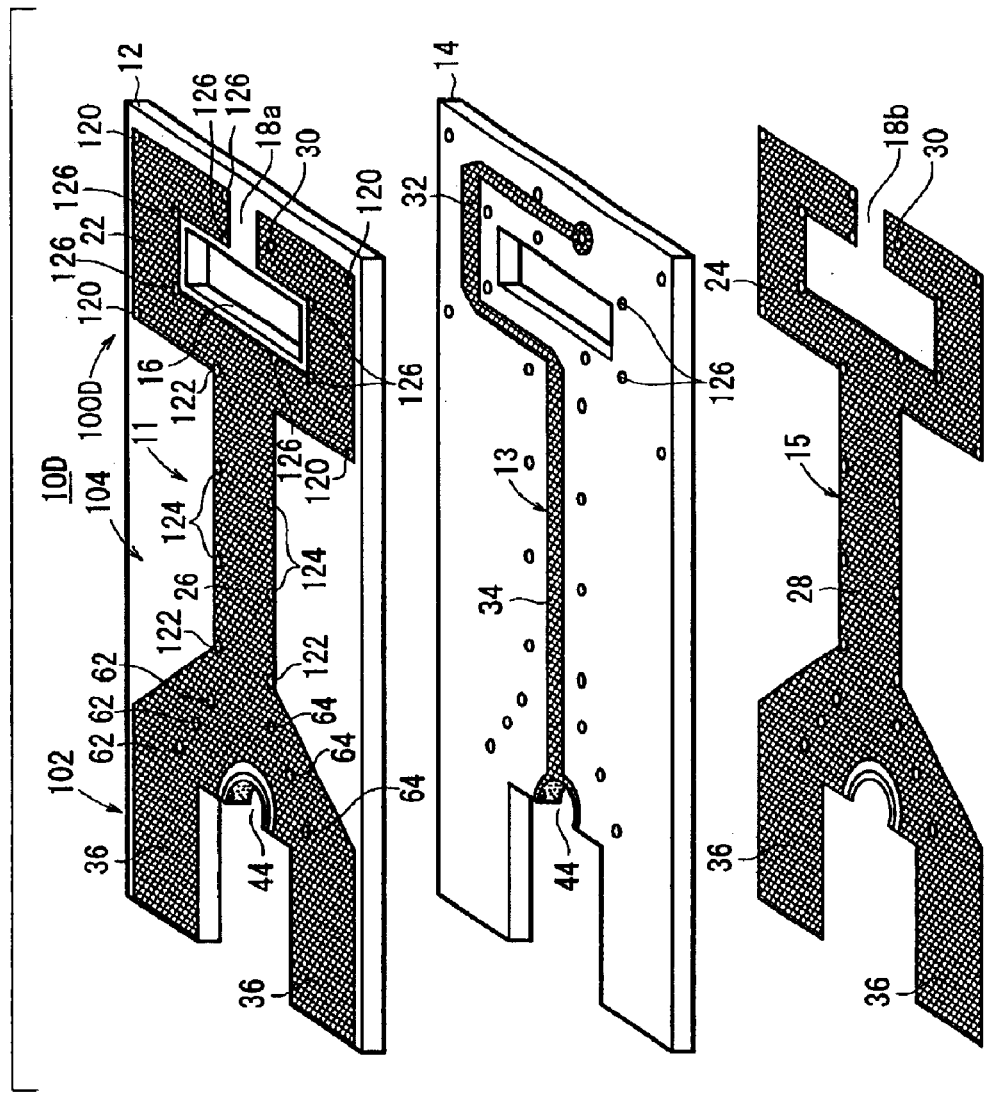
FIG. 18 is an exploded perspective view of a magnetic sensor (with a via pattern 2) according to a fifth embodiment of the present invention.

FIGS. 16, 17, and 18 show magnetic sensors 10B, 10C, 10D, respectively, according to third, fourth, and fifth embodiments of the present invention. Those parts of the magnetic sensors 10B, 10C, 10D and magnetic sensors according to other embodiments which are identical to those shown in FIGS. 1 through 15 are denoted by identical reference characters, and will not be described in detail below.

The magnetic sensor 10B shown in FIG. 16 has vias (ground vias) 120 interconnecting the four outer corners of the one-turn looped ground patterns 22, 24 which make up a shielded loop coil 10B, and vias (ground vias) 122 interconnecting the four corners at the opposite ends of the ground lead patterns 26, 28 of the output lead 104.

The magnetic sensor 10C shown in FIG. 17 includes a shielded loop coil 100C and has, in addition to the vias 120, 122, four symmetrical vias (ground vias) 124 in pairs spaced along the axis of the ground lead patterns 26, 28 of the output lead 104.

The magnetic sensor 10D shown in FIG. 18 includes a shielded loop coil 100D and has, in addition to the vias 120, 122, 124, vias (ground vias) 126 disposed along the substantially C-shaped signal line 32 and at the four internal corners of the opening hole 16.

If the vias 120, 122, 124, 126 are not present, then the confronting upper and lower conductive metals of the looped ground patterns 22, 24 and the ground lead patterns 26, 28 may act as independent electrodes for the high-frequency electromagnetic field, building an unwanted resonance cavity which makes the sensor sensitivity moderately frequency-dependent in the vicinity of 10 GHz.

The vias 120, 122, 124, 126 and the vias 62, 64 in the sleeve-shaped ground patterns 36 strongly connect the all the upper and lower ground electrodes electrically to each other. Therefore, the looped ground patterns 22, 24 and the ground lead patterns 26, 28 are prevented from acting as independent electrodes, resulting in the elimination of an unwanted mode generation and providing flat response characteristics up to high frequencies.

In the frequency band higher than 3 GHz, the sensor sensitivity may possibly be decreased gradually up to about several dB. However, the vias 120, 122, 124 in the structures shown in FIGS. 16 through 18 are effective to fully prevent the sensitivity decrease.

The magnetic sensor 10D shown in FIG. 18 with the vias 126 disposed inside the one-turn looped ground patterns 22, 24, i.e., inside the coil, has its sensitivity curve which is essentially the same as the magnetic sensor 10B shown in FIG. 16.

Practically, a magnetic sensor with vias disposed only inside or outside the one-turn looped ground patterns 22, 24, i.e., only inside or outside the coil, provides ideal sensitivity characteristics.

While the vias 120, 122, 124, 126 are primarily provided for the purpose of suppressing an unwanted mode generation and allowing the magnetic sensor 10 to have ideal sensitivity characteristics, they also possibly provide an electric field shield effect as they form ground short-circuited lines alongside of the signal lead line 34.

Figure 19:
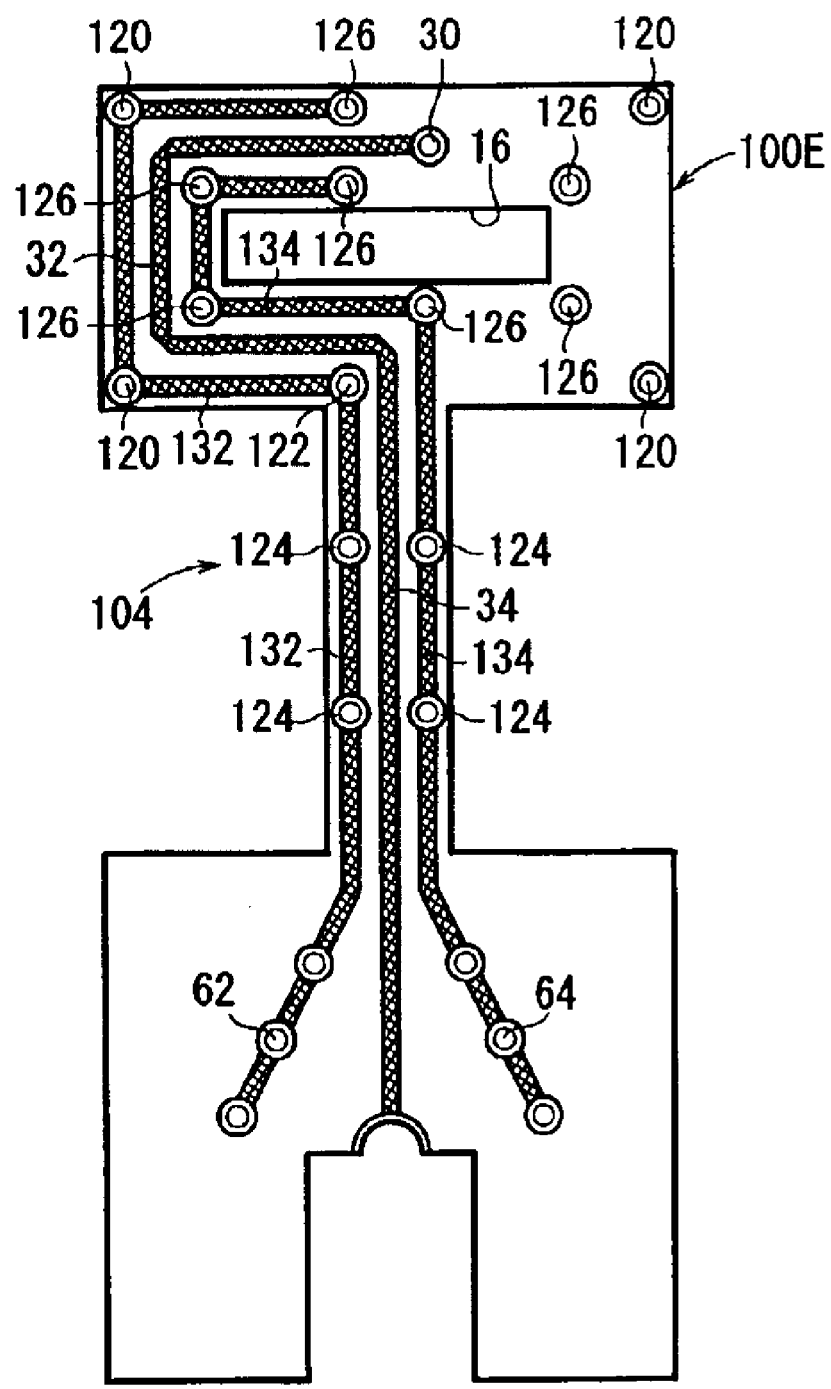
FIG. 19 is a front elevational view of inner conductors (with a ground conductor line pattern 1) of a magnetic sensor according to a sixth embodiment of the present invention.
Figure 20:
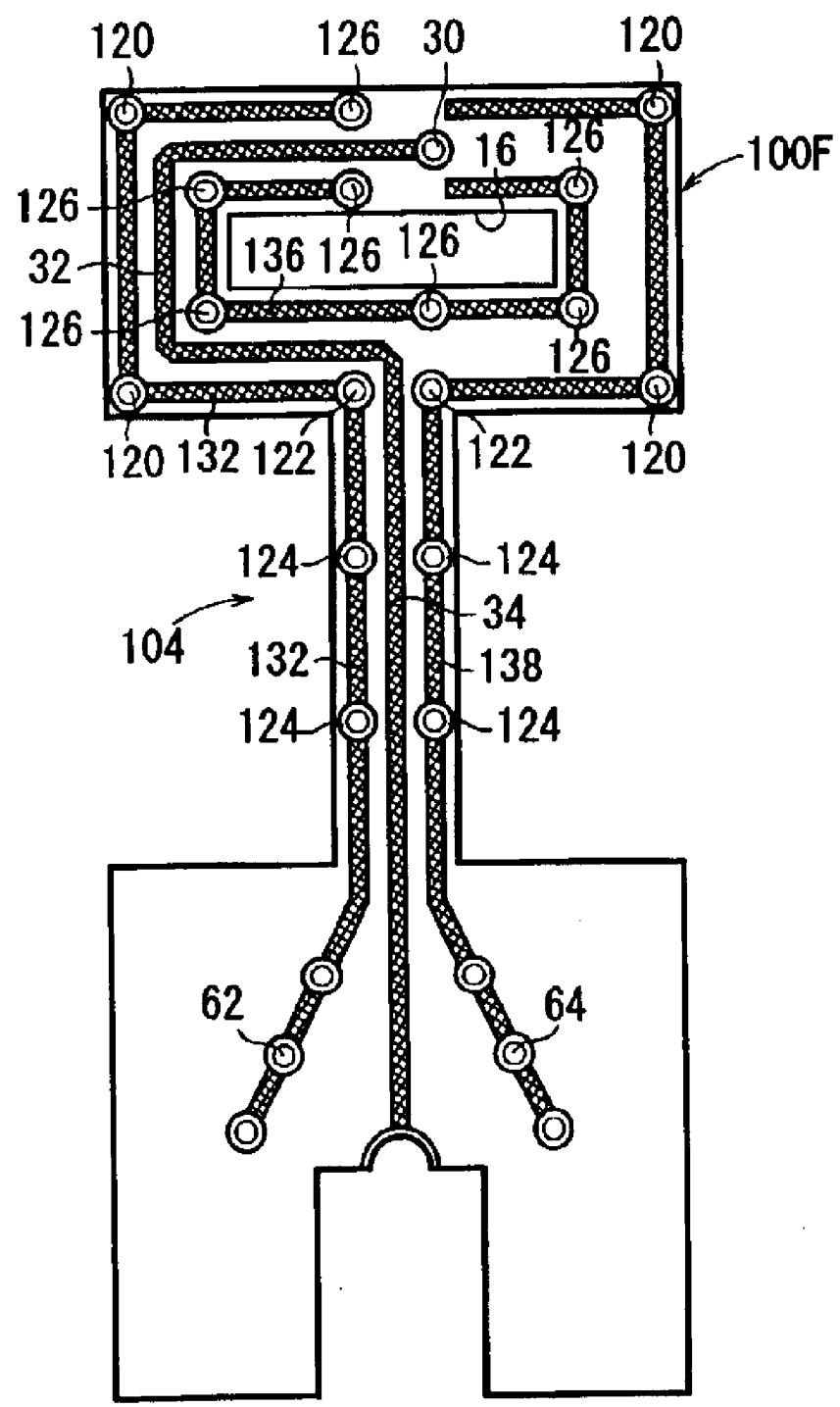
FIG. 20 is a front elevational view of inner conductors (with a ground conductor line pattern 2) of a magnetic sensor according to a seventh embodiment of the present invention.

FIGS. 19 and 20 show in front elevation magnetic sensors 10E, 10F according to sixth and seventh embodiments, respectively, of the present invention.

The magnetic sensor 10E shown in FIG. 19 includes a shielded loop coil 100E and has ground conductor lines 132, 134 disposed one on each side of and extending along the substantially C-shaped signal line 32 and the signal lead line 34 of the output lead 104, the ground conductor lines 132, 134 interconnecting the ground vias 120, 122, 124, 126, 62, 64.

The magnetic sensor 10F shown in FIG. 20 includes a shielded loop coil 100F and has a ground conductor line 132 disposed on one side of and extending along the substantially C-shaped signal line 32 and the signal lead line 34 of the output lead 104, the ground conductor line 132 interconnecting the ground vias 120, 122, 124, 126, 62, a ground conductor line 136 disposed on the other side of and extending along the substantially C-shaped signal line 32 and the opening 16, the ground conductor line 136 interconnecting the vias 126, and a ground conductor line 138 extending along an outer edge of the shielded loop coil 100F and the outer lead 104 and interconnecting the vias 120, 122, 124, 64.

In the magnetic sensors 10E, 10F shown in FIGS. 19, 20, since a distributed capacitance occurs between the ground and the substantially C-shaped signal line 32 and the signal lead line 34 along which the ground conductor lines 132, 134, 136, 128 are disposed, the impedance is lower than 50Ω if the signal lines have the same width as the signal lines of the magnetic sensors 10A through 10D.

To avoid such a reduction in the impedance, the width of the substantially C-shaped signal line 32 and the signal lead line 34 of the magnetic sensors 10E, 10F shown in FIGS. 19, 20 is reduced while the outer profile of the magnetic sensors 10E, 10F may remain unchanged in dimensions.

If the ground conductor lines 132, 134, 136, 138 are not provided on both sides of the substantially C-shaped signal line 32 and the signal lead line 34, then the signal generated by the magnetic sensor from the high-frequency electromagnetic field suffers a leakage of about −30 [dB]. With the ground conductor lines 132, 134, 136, 138 provided on both sides of the substantially C-shaped signal line 32 and the signal lead line 34, the substantially C-shaped signal line 32 and the signal lead line 34 are surrounded by a ground pattern as a result, which provides a shield effect to reduce the signal leakage to −5 [dB] in a low frequency range and to −20 [dB] compared with the device without the ground conductor lines 132, 134, 136, 138 in a GHz frequency range.

The transmission line structures shown in FIGS. 19, 20 can be regarded as a grounded coplanar line structure. Specifically, the width of the substantially C-shaped signal line 32 and the signal lead line 34 is not changed, but the ground conductor lines 132, 134, 136, 138 of the inner conductor layer 13 are positioned closely to the substantially C-shaped signal line 32 and the signal lead line 34, and the width of the looped ground patterns 22, 24 and the ground lead patterns 26, 28 of the first surface conductor layer 11 and the second surface conductor layer 15 is reduced for an impedance match with 50Ω.

Since the coil line width can physically be reduced with the above grounded coplanar line structure, the grounded coplanar line structure is effective to locally specify an area in which a magnetic field is to be detected and reduce the size of the coil itself. This is a notable feature.

In addition to the fact that the looped ground patterns 22, 24 and the ground lead patterns 26, 28 are several times greater in width than the substantially C-shaped signal line 32 and the signal lead line 34, the conductors of the looped ground patterns 22, 24 and the ground lead patterns 26, 28 are thicker than the skin depth, and the intensity of an electromagnetic field that directly enters the substantially C-shaped signal line 32 and the signal lead line 34 which are sandwiched between the looped ground patterns 22, 24 and the ground lead patterns 26, 28 is considerably smaller than the magnitude of an external electromagnetic field.

In fact, the result of an electromagnetic field simulation analysis according to a process for strictly solving the Maxwell's equations indicates that the strength of the electromagnetic field is of a value of −30 [dB] or less, which agrees with the above experimental result.

In applications where a usual triplate-structure transmission line is used, an actual shield effect that is obtained is small if vias are provided as dots at spaced intervals in the inner conductor layer 13.

While the shield effect of the ground conductor lines 132, 134, 136, 138 in the magnetic sensors 10E, 10F according to the sixth and seventh embodiments shown in FIGS. 19, 20 is large compared with a magnetic sensor with vias provided as dots at spaced intervals, it is not substantially larger than the original shield effect of the looped ground patterns 22, 24 and the ground lead patterns 26, 28.

However, if a high shield capability is required as in a magnetic sensor incorporated in a permeameter to be described below, then the shield effect of the ground conductor lines 132, 134, 136, 138 plays an important role.

Figure 21:
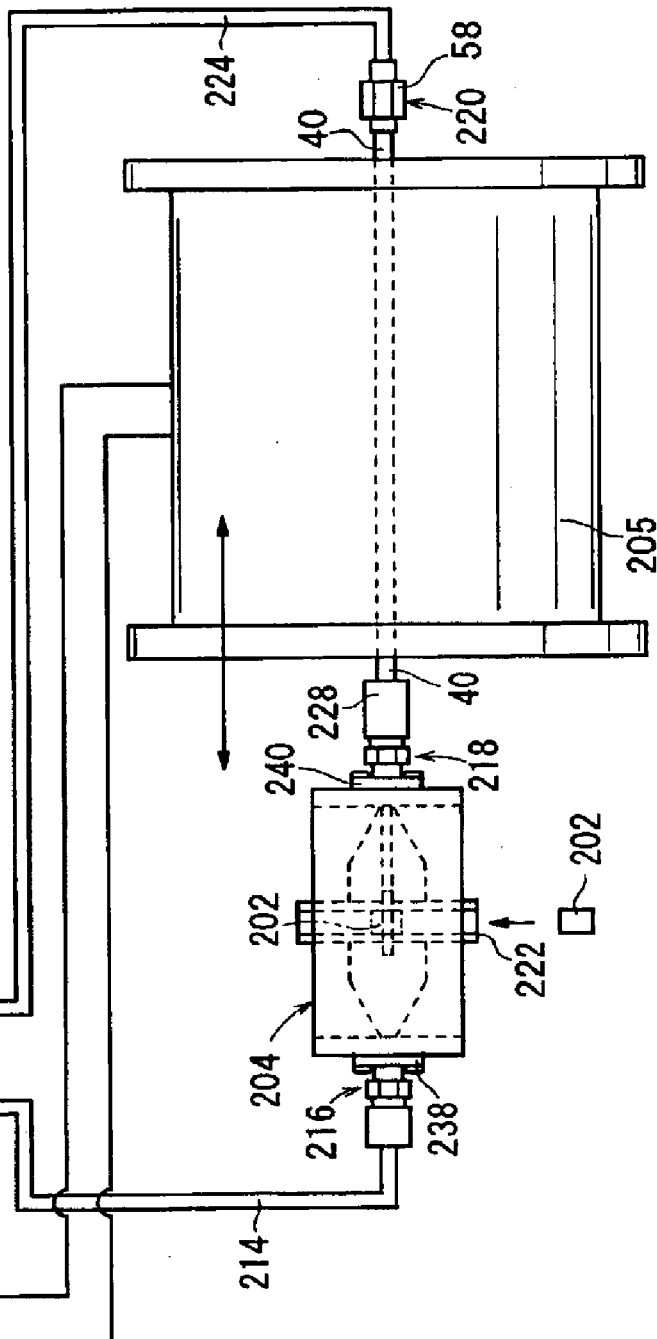
FIG. 21 is a view, partly in block form, of a permeameter according to an eighth embodiment of the present invention.

FIG. 21 shows in block form a permeameter 200 according to an eighth embodiment of the present invention.

The permeameter 200 is an apparatus for measuring a complex permeability of a magnetic specimen 202 such as a magnetic thin film material or the like.

The permeameter 200 comprises a side-opened TEM cell 204, details of which will be described later on, functioning as a uniform high-frequency electromagnetic field generating device which receives a magnetic specimen 202 inserted horizontally therein, and a solenoid coil 205 for holding the side-opened TEM cell 204 with the magnetic specimen 202 held therein and applying a DC saturated magnetic field and an unsaturated magnetic field to the magnetic specimen 202. For measuring a permeability of the magnetic specimen 202, the solenoid coil 205 is displaced to the left until the side-opened TEM cell 204 is positioned centrally in the solenoid coil 205.

The solenoid coil 205 is supplied with a predetermined current from a DC power supply 210 which is controlled for the amount of the current by a personal computer 208 through a GPIB (General Purpose Interface Bus) interface, not shown. The personal computer 208 has the GPIB interface, and is connected to a display monitor 192, a keyboard 194, and a mouse 196.

The side-opened TEM cell 204 has an input terminal, a coaxial connector 238, supplied with an input wave E1$i$ through a coaxial cable 214 from a port P1 of a network analyzer 212 whose operation is controlled by the personal computer 208 through the GRIB interface.

The side-opened TEM cell 204 has an output terminal, a coaxial connector 240, terminated by a terminator 228 having an impedance of 50Ω. The side-opened TEM cell 204 whose coaxial connector 240 is terminated by the 50Ω terminator 228 functions as the uniform high-frequency electromagnetic field generating device.

Figure 22:
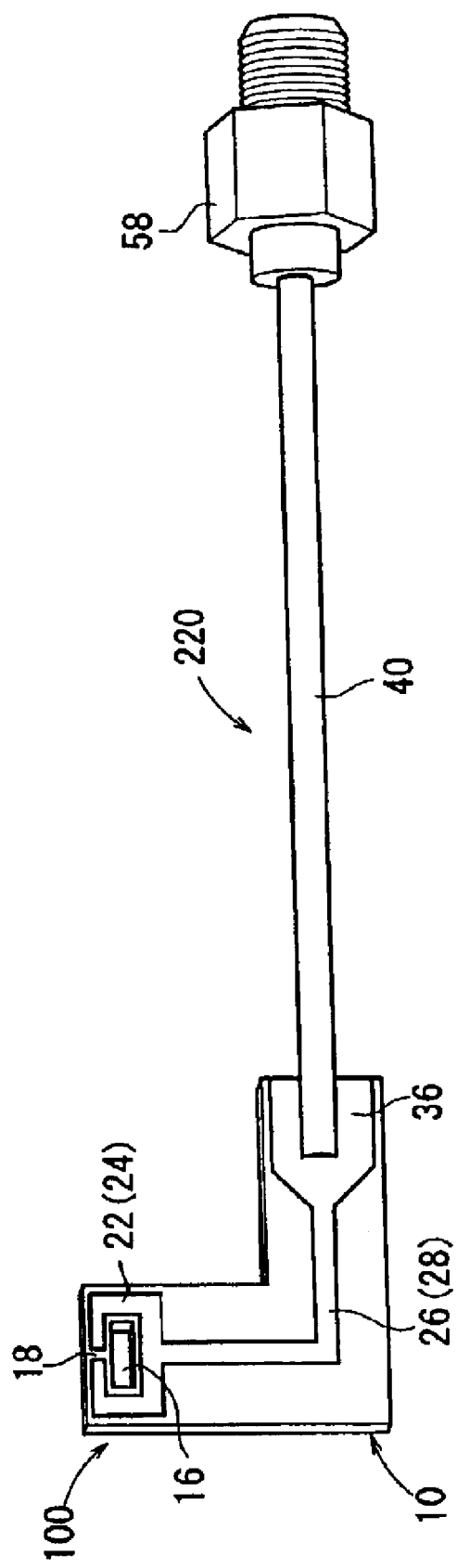
FIG. 22 is a perspective view of a magnetic sensor assembly.

FIG. 22 shows a magnetic sensor assembly 220 incorporated in the permeameter 200. As shown in FIG. 22, the magnetic sensor assembly 220 has an L-shaped magnetic sensor 10 (representing the magnetic sensor 10 shown in FIG. 10 and the other magnetic sensors 10B through 10G) having a shielded loop coil 100 (representing the shielded loop coil 100 shown in FIG. 1 and the other shielded loop coils 100B through 100G).

Figure 23:
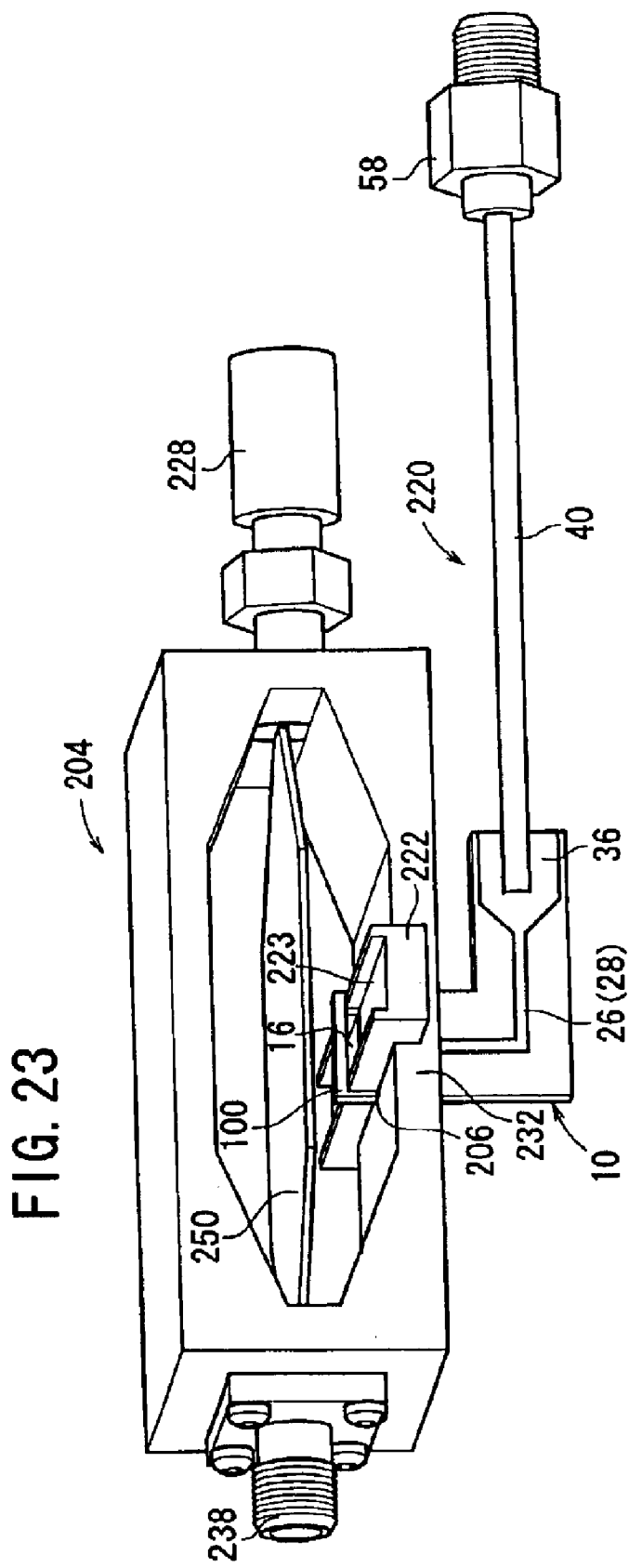
FIG. 23 is a perspective view of a side-opened TEM cell with the magnetic sensor assembly attached thereto.

As shown in FIG. 23, the shielded loop coil 100 of the magnetic sensor assembly 220 is inserted into a slit opening 206 defined in a bottom ground electrode of the side-opened TEM cell 204.

After the shielded loop coil 100 is inserted in the slit opening 206, specimen holders 222 made of a synthetic resin such as polytetrafluoroethylene or the like are positioned respectively on opposite sides of the opening hole 16 in the shielded loop coil 100, and fixed in position.

The magnetic specimen 202 is horizontally inserted into channel-shaped grooves 223 in the specimen holders 222, and inserted into the opening hole 16, so that the magnetic specimen 202 can be measured for its complex permeability.

A signal representing the measured complex permeability, i.e., an induced voltage V, is transmitted through the coaxial line 40 and a coaxial cable 224 and supplied as a transmission wave E2$r$ on an output side to a port P2 of the network analyzer 212.

The network analyzer 212 calculates a forward transmission coefficient S21 (S parameter) from the input wave E1$i$ and the transfer wave E2$r$, and sends the calculated forward transimission coefficient S21 to the personal computer 208. Furthermore, as described later on, the network analyzer 212 calculates an input end reflection coefficient S11 from the input wave E1$i$ and a reflection wave E1$r$ on an input side, and an output end reflection coefficient S22 from an input wave E2$i$ and a reflection wave E2$r$ on the output side, and sends the calculated reflection coefficients S11, S22 to the personal computer 208.

Prior to a detailed description of operation of the permeameter 200 shown in FIG. 21, i.e., a detailed description of a process of calculating a permeability, various TEM cells that can be used as the uniform high-frequency electromagnetic field generating device of the permeameter 200 will be described below.

Figure 24:
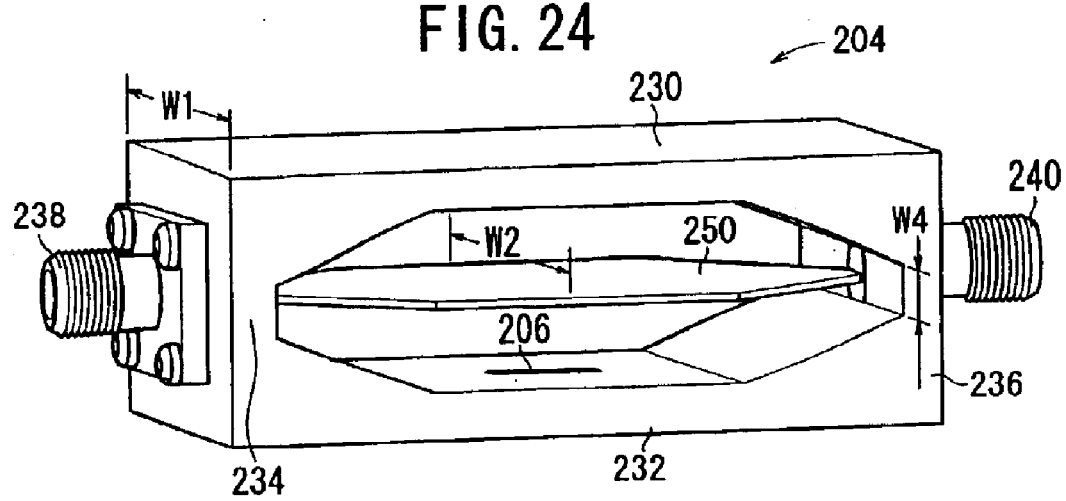
FIG. 24 is a perspective view of a unitary type side-opened TEM cell according to a ninth embodiment of the present invention.

FIG. 24 shows in perspective a unitary type side-opened TEM cell 204 according to a ninth embodiment of the present invention, the unitary type side-opened TEM cell 204 being machined from stock.

Figure 25:
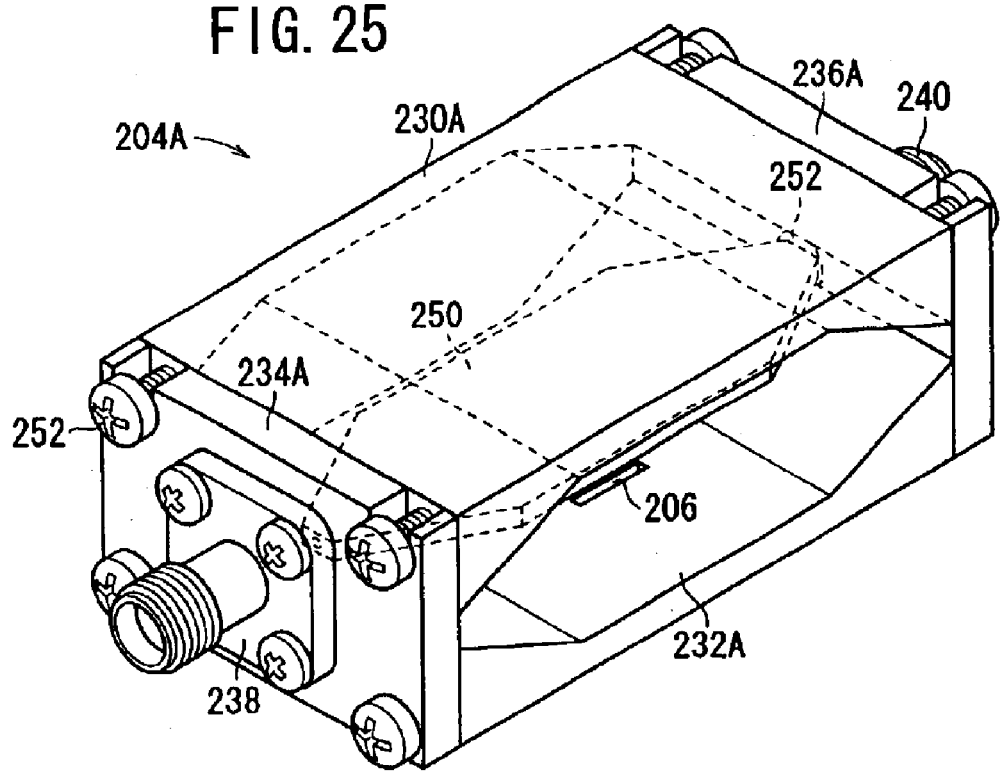
FIG. 25 is a perspective view of a buildup type side-opened TEM cell according to a tenth embodiment of the present invention.

FIG. 25 shows in perspective a buildup type side-opened TEM cell 204A according to a tenth embodiment of the present invention.

Figure 26:
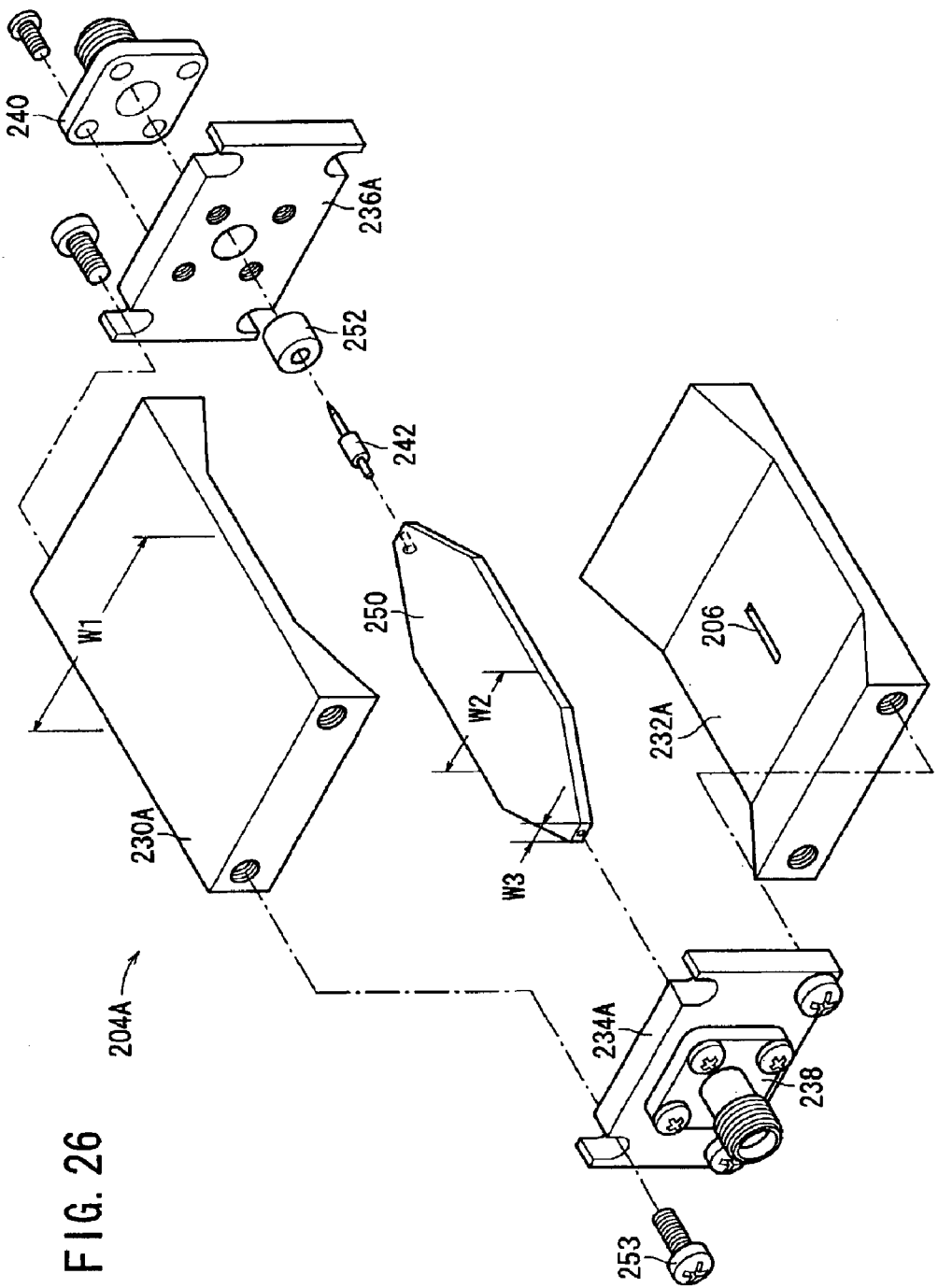
FIG. 26 is an exploded perspective view of the buildup type side-opened TEM cell.

FIG. 26 shows in exploded perspective the buildup type side-opened TEM cell 204A according to the tenth embodiment.

The unitary type side-opened TEM cell 204 shown in FIG. 24 is in the form of a high-frequency cavity ground body which comprises upper and lower ground electrodes 230, 232 and opposite end ground electrodes 234, 236 which are machined from a conductor in the shape of a rectangular parallelepiped (e.g., a block in the shape of a rectangular parallelepiped having a width of 30 mm, a height of 19 mm, and a length of 51.7 mm), leaving a cavity having a horizontally elongate octagonal cross-sectional shape with four corners beveled vertically from longitudinal sides thereof (the cavity has upper and lower sides 20 [mm] long, four slanted sides 13.5 [mm] long, and opposite end sides 3 [mm] long).

The buildup type side-opened TEM cell 204A shown in FIGS. 25 and 26 has an outer profile identical in shape to the unitary type side-opened TEM cell 204 shown in FIG. 24. However, the buildup type side-opened TEM cell 204A shown in FIGS. 25 and 26 is in the form of a high-frequency cavity ground body which comprises upper and lower ground electrodes 230A, 232A and opposite end ground electrodes 234A, 236A which are separable from and combinable with each other. When the upper and lower ground electrodes 230A, 232A and the opposite end ground electrodes 234A, 236A are combined with each other, they jointly are in the shape of a rectangular parallelepiped with a cavity defined therein which has a horizontally elongate octagonal cross-sectional shape with four corners beveled vertically from longitudinal sides thereof.

In the unitary type side-opened TEM cell 204 shown in FIG. 24 and the buildup type side-opened TEM cell 204A shown in FIGS. 25 and 26, the opposite end ground electrodes 234, 234A, 236, 236A have respective central holes, 3.35 mm deep, defined therein for attaching first and second high-frequency coaxial connectors 238, 240 of the panel mount type, and the first and second high-frequency coaxial connectors 238, 240 are mounted in these holes. The depth of the holes is the same as the length of guides 252 (see FIG. 26) made of a synthetic resin such as polytetrafluoroethylene or the like which support respective central pins 242 of the first and second high-frequency coaxial connectors 238, 240.

Figure 27:
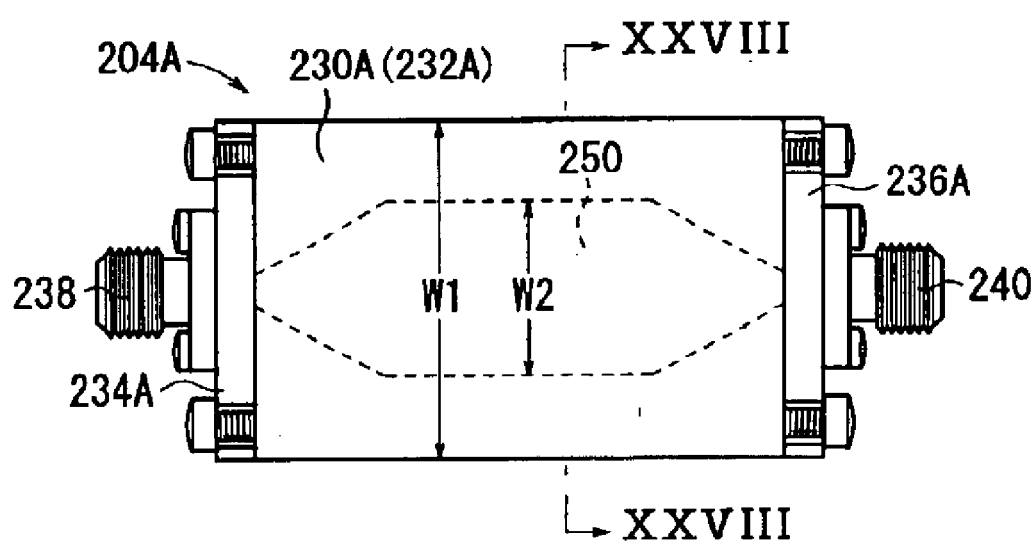
FIG. 27 is a front elevational view of the buildup type side-opened TEM cell.

A high-frequency signal electrode 250 is disposed between confronting electrodes of the central pins 242 and lies parallel to the upper and lower ground electrodes 230, 230A, 232, 232A. The high-frequency signal electrode 250 comprises a plate in the shape of a horizontally elongate octagonal shape with four corners beveled, the plate having a width W2 equal to or narrower than 0.7 times the width W1 of the upper and lower ground electrodes 230, 230A, 232, 232A (W2≦0.7×W1: see FIG. 27). The plate is made of Cu and has a thickness of 1 mm, a width of 16 mm, and a length of 45 mm with four corners each beveled 12.5 mm longitudinally and 7.17 mm transversely.

Joints between the high-frequency signal electrode 250 and the central pins 242 are finished to completely flat surfaces to provide an impedance of 50Ω over the full length of the high-frequency cavity which has a triplate transmission line.

The high-frequency cavity provides a side-opened TEM cell with its opposite sides being open whereas ordinary TEM cells have all sides covered with ground electrodes.

With the side-opened TEM cells 204, 204A thus constructed, the high-frequency signal electrode 250 and the upper and lower ground electrodes 230, 230A, 232, 232A make up a triplate transmission line between the high-frequency connectors 238, 240.

Figure 28:
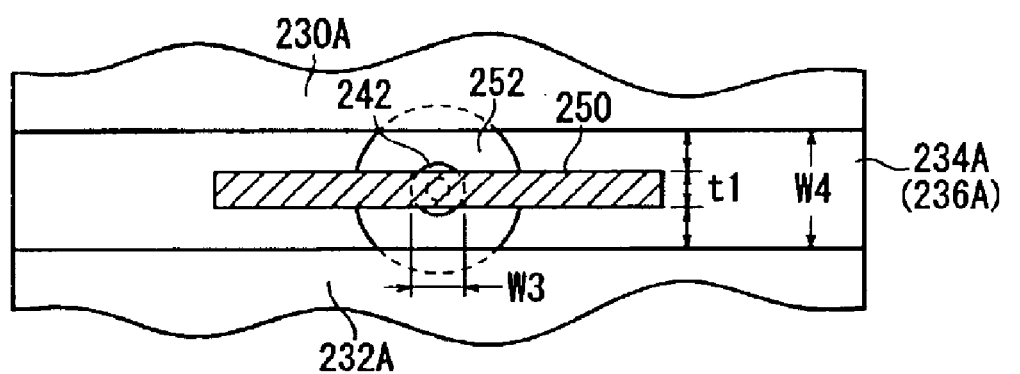
FIG. 28 is a cross-sectional view taken along line XXVIII—XXVIII of FIG. 27.

As shown in FIG. 28, the plate-shaped high-frequency signal electrode 250 has an attachment end face joined to the central pin 242 of the high-frequency coaxial connector 240, the attachment end face having a width W3 equal to or smaller than three times the thickness (signal plate thickness) t1 of the plate-shaped high-frequency signal electrode 250 (W3≦3×t1) to maintain the impedance of 50Ω over the full length of the triplate transmission line.

As shown in FIGS. 24 and 28, the opposite ends of the upper and lower ground electrodes 230, 230A, 232, 232A which are joined to the respective opposite end ground electrodes 234, 234A, 236, 236A have respective lower and upper edges vertically spaced from each other by a distance W4.

As shown in FIG. 26, the central pins 242 are fitted in the respective dielectric bushings 252, and fixedly fitted in respective openings in the opposite end ground electrodes 234A, 236A and respective openings in the coaxial connectors 238, 240.

To assemble the buildup type side-opened TEM cell 204A shown in FIG. 26, the plate-shaped high-frequency signal electrode 250 is fixed by an electrically conductive adhesive to the central pins 242 inserted into the bushings 252 in the opposite end ground electrodes 234A, 236A to which the coaxial connectors 238, 240 are fastened, and the upper and lower ground electrodes 230A, 232A are fastened to the opposite end ground electrodes 234A, 236A by screws 253 of a nonmagnetic material such as synthetic resin, brass, and so on. At this time, the upper and lower ground electrodes 230A, 232A are vertically adjusted in position, i.e., the distance therebetween is adjusted, through clearances in the holes through which the screws 253 pass.

The buildup type side-opened TEM cell 204A thus assembled, as well as the unitary type side-opened TEM cell 204 shown in FIG. 24, has its impedance controlled at 50±1Ω over its entire length.

The side-opened TEM cells 204, 204A can be designed in shape and size with considerable freedom. In order for them to provide good characteristics up to as high frequencies as possible, however, it is preferable that the signal line width W2 be equal to or narrower than 0.7 times the cavity ground width W1, the thickness of the signal electrode 250 be equal to or larger than a value which makes any impedance error due to flexing depending on the cavity length equal to or smaller than 5Ω, and the width W3 of the end face of the signal electrode 250 joined to the central pin 242 be equal to or less than three times the thickness t1. Though there is no particular limitation on the cavity length, it is advantageous for the cavity length to be large for utilizing a uniform electromagnetic field in a wide range.

In the above description, the ground electrode shape which is of an elongate rectangle when the cavity is viewed from above has been assumed. However, the cavity of the transmission line does not require the ground electrode to be wide up to its portions connected to the coaxial connectors. Therefore, as with the ordinary TEM cells, the ground electrode may be changed to a shape where the four corners are beveled to provide a structure which is progressively tapered off toward the coaxial connectors 238, 240.

With the side-opened TEM cells 204, 204A thus constructed, since an electromagnetic field distribution in a coaxial mode is simply converted into an electromagnetic field distribution in a side-opened triplate cavity, the mode conversion is relatively smooth. As a result, the side-opened TEM cells 204, 204A do not suffer a large insertion loss in a superhigh frequency range as is the case with the doublet transmission lines, but have a transmission loss of 0.5 [dB] or lower even at 10 GHz.

Figure 29:
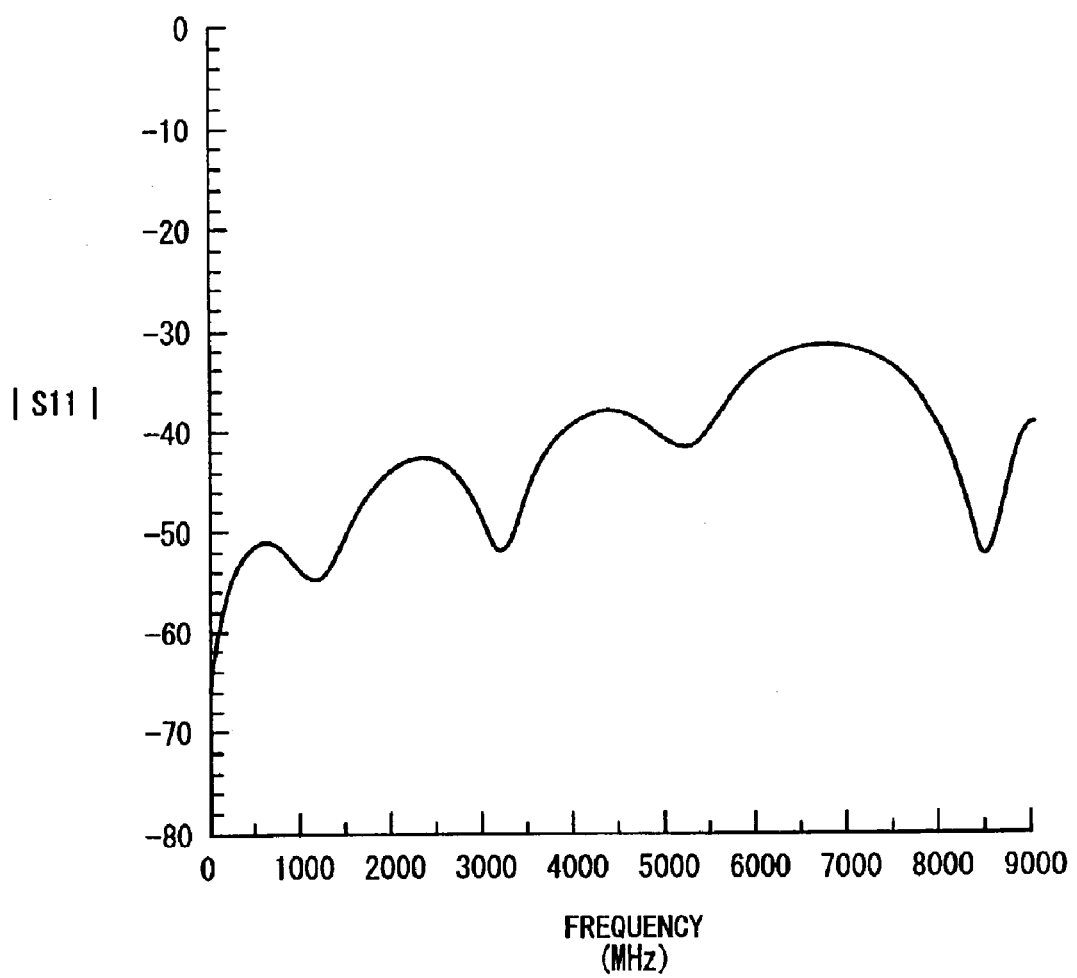
FIG. 29 is a characteristic diagram of a measured input terminal reflection coefficient of a side-opened TEM cell.

FIG. 29 shows a measured input terminal reflection coefficient S11 of the side-opened TEM cells 204, 204A only. As shown in FIG. 29, the measured input terminal reflection coefficient S11 is at most −30 [dB] up to 9 GHz. In view of this fact together with the value of the insertion loss, the strength of a high-frequency electromagnetic field generated in the cavity can be kept constant within several % independently of the frequency.

The side-opened TEM cells 204, 204A of the above structure and high-frequency characteristics are terminated by the 50Ω terminator 228, and used in the permeameter 200 shown in FIG. 21.

The permeameter 200 may also employ a side-opened TEM cells 204, 204A with short termination, rather than the 50Ω termination to use as a uniform high-frequency electromagnetic field generating device.

In the case, each of the side-opened TEM cell 204, 204A functions as a standing-wave mode type side-opened TEM cell.

A detailed description of the permeameter 200 shown in FIG. 21, which uses the triplate side-opened TEM cells 204, 204A as a uniform high-frequency electromagnetic field generating device, i.e., a detailed description of a process of calculating a permeability, will be described below.

The network analyzer 212 applies a high-frequency signal as an input wave E1i to the high-frequency cavity (the TEM cell 204 or the TEM cell 204A) which is of a parallel transmission line structure having an impedance of 50Ω through the high-frequency coaxial connector 238 which is connected to one end of the high-frequency cavity.

At this time, the other end of the high-frequency cavity is short-terminated or impedance-matched by a terminal resistor, generating a uniform high-frequency magnetic field perpendicular to the direction in which the high-frequency signal travels and parallel to the parallel transmission line, i.e., in the axial direction of the magnetic specimen 202 inserted in the opening hole 16.

First, it is assumed that the side-opened TEM cell 204, 204A functions as a high-frequency uniform electromagnetic field generating device.

The input wave E1i as a constant high-frequency voltage is supplied from the port P1 of the network analyzer 212 to the input terminal 216 of the side-opened TEM cell 204, 204A which accommodates therein the one-turn coil of the magnetic sensor assembly 220.

In the vicinity of the center of an upper half or a lower half (where the magnetic sensor assembly 220 is inserted) of the cavity of the side-opened TEM cell 204, 204A (the center of the lower half of the cavity is substantially aligned with a central point 400 of the opening hole 16, shown in FIG. 12, in the magnetic sensor 10), an electric field is uniformly generated as parallel electric lines of force perpendicularly to the direction in which the high-frequency signal is propagated, from the high-frequency signal electrode 250 as a signal conductor toward the upper and lower ground electrodes 230, 232. A magnetic field is uniformly generated as parallel magnetic lines of force perpendicularly to the direction in which the high-frequency signal is propagated and the direction of the electric field, i.e., parallel to the high-frequency signal electrode 250 and the upper and lower ground electrodes 230, 232.

The strengths of the generated magnetic and electric fields which are proportional to the amplitude of the applied high-frequency voltage are uniform in a three-dimensional range (where the magnetic and electric fields are directed perpendicularly to each other and their intensities are constant) which is large enough to enclose the effective area within the central lines 64, 66 shown in FIG. 4 and the volume of the magnetic specimen 202 in the vicinity of the center of the lower half of the side-opened TEM cell 204, 204A.

The permeameter 200 in which the triplate side-opened TEM cell 204, 204A function as a high-frequency uniform electromagnetic field generating device is a highly excellent apparatus because the high-frequency magnetic field applied to the magnetic specimen 202 is highly uniform, the average electric energy supplied to the permeameter 200 is constant, and the permeameter 200 generates a stronger magnetic field with the same signal input than other permeameters.

The shielded loop coil 100 of the magnetic sensor 10 is placed in the high-frequency magnetic field generated in the side-opened TEM cell 204, 204A such that the opening hole 16 in the shielded loop coil 100 crosses the high-frequency magnetic field and the gap 18 confronts the high-frequency signal electrode 250 which serves as a high-frequency transmission line of the parallel transmission line. The magnetic specimen 202 is inserted horizontally into the opening hole 16.

Thus, the substantially constant high-frequency signal is applied from the network analyzer 212 to the cavity of the triplate parallel transmission line structure having an impedance of 50Ω through the coaxial connector 238 as an SMA connector on the left end of the triplate side-opened TEM cell 204 (which represents both the side-opened TEM cells 204, 204A), and the coaxial connector 240 as another SMA connector on the right end of the triplate side-opened TEM cell 204 is impedance-matched by the terminator 228.

Since the impedance matching with 50Ω is substantially achieved over almost all transmission path from the high-frequency signal source through the cavity to the terminator 228, a TEM-mode traveling wave is generated in the cavity independently of the frequency. Accordingly, a high-frequency magnetic field is generated in the cavity perpendicularly to the direction of the traveling wave. The high-frequency magnetic field is a uniform high-frequency magnetic field having an amplitude proportional to the applied voltage.

The magnetic sensor 10 is placed at the center of the high-frequency magnetic field and directed perpendicularly to the high-frequency magnetic field and parallel to the direction in which the high-frequency magnetic field travels.

The specimen holders 222 made of a synthetic resin such as polytetrafluoroethylene or the like are positioned respectively on the opposite sides of the opening hole 16 in the shielded loop coil 100. The magnetic specimen 202 is horizontally placed on the specimen holders 222 in and across the opening hole 16.

Then, an external DC magnetic field is applied, with its magnitude varying, in the same direction as the direction in which the high-frequency magnetic field travels, from the solenoid coil 205 that is supplied with a current from the DC power supply 210 which is controlled for the amount of the current by the personal computer 208.

The induced voltage V of the magnetic sensor 10, i.e., the forward transmission coefficient S21, and the impedance of the magnetic sensor 10, i.e., the input end reflection coefficient S11 and the output end reflection coefficient S22 are measured by the network analyzer 212 when the magnetic specimen 202 is magnetically saturated and when the magnetic specimen 202 is magnetically unsaturated, respectively, and a complex permeability of the magnetic specimen 202 is calculated by the personal computer 208. The calculated (measured) results are displayed on the display monitor 192.

The solenoid coil 205 is disposed around the side-opened TEM cell 204 which serves as a high-frequency fixture, for applying an external DC magnetic field to the magnetic specimen 202 in the same direction as the direction in which the high-frequency signal travels. The magnitude of the external DC magnetic field varies. Forward transmission coefficients S21s, S21n which are represented by induced voltages of the magnetic sensor 10 and impedances Zs, Zn of the magnetic sensor 10 are measured as complex numbers when the magnetic specimen 202 is magnetically saturated and when the magnetic specimen 202 is magnetically unsaturated, respectively.

The complex relative permeability pr of the magnetic specimen 202 inserted in the opening hole 16 is calculated by the following equation (2):

$$\mu r = 1 + [S21n(Zn+50)/S21s(Zs+50)-1]/F \tag{2}$$

where F represents the ratio (m/n) of the cross-sectional area of the magnetic specimen 202 which faces the high-frequency magnetic field (since the magnetic specimen 202 is in the shape of a flat rectangular parallelepiped, the cross-sectional area, referred to as m, thereof lies in a direction perpendicular to the longitudinal axis of the magnetic specimen 202) to the cross-sectional area inside the coil (the area, referred to as n, inside of the looped ground patterns 22, 24 and slightly greater than the opening hole 16).

The permeameter 200 described above has employed the triplate side-opened TEM cells 204, 204A having the triplate cavity with a traveling wave mode, when the side-opened TEM cell 204 operates as the standing-wave mode cavity with short terminal, then the permeameter 200 can measure permeability in a frequency range up to 2 through 3 GHz.

On the other hand, the permeameter 200 employing the side-opened TEM cell 204 which utilizes a high-frequency electromagnetic field in a traveling-wave mode is operable in a wide frequency range as no standing wave is produced in the cavity, and is capable of measuring permeability in a higher frequency range up to 9 GHz or higher.

The permeameter 200 employing the triplate side-opened TEM cell 204 is capable of producing a high-frequency magnetic field which is more spatially uniform than a permeameter employing a doublet standing-wave mode cavity with its short-termination. The strength of the applied high-frequency magnetic field produced by the permeameter employing the triplate side-opened TEM cell 204 is substantially the same as or much greater at frequencies in excess of 1 GHZ than a permeameter employing the doublet standing-wave cavity. Therefore, it can be seen that the permeameter 200 which employs the triplate side-opened TEM cell 204 in the traveling-wave mode is more advantageous.

Figure 30:
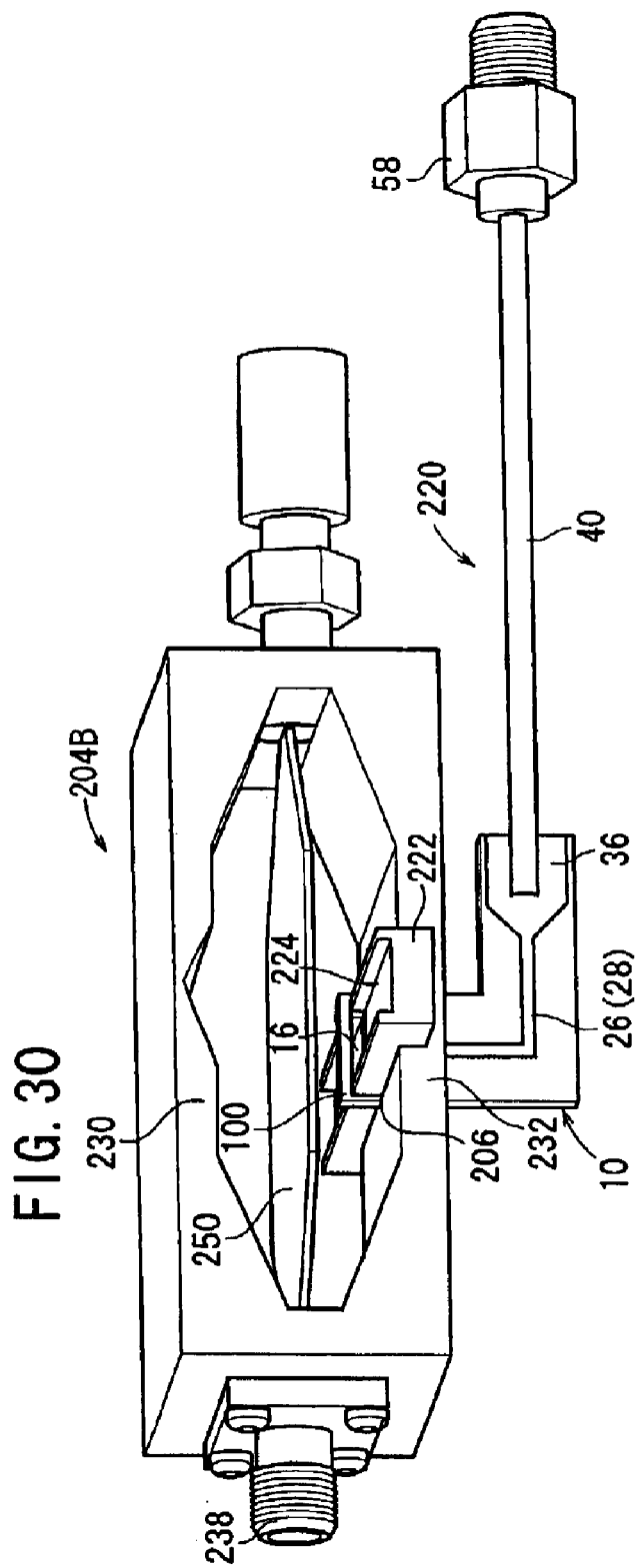
FIG. 30 is a perspective view of a side-opened TEM cell with an upper ground electrode machined according to an eleventh embodiment of the present invention.

FIG. 30 shows in perspective a side-opened TEM cell 204B with an upper ground electrode 230 machined to provide a recess above the cavity of the side-opened TEM cell 204 shown in FIG. 23, according to a eleventh embodiment of the present invention. When the magnetic sensor 10 is inserted into the cavity of the side-opened TEM cell 204, the impedance of the inserted region is lowered about $3.7\Omega$. This is because the magnetic sensor 10 with a small load impedance basically acts to scatter the energy from the cavity, causing a distinct reduction in the impedance and applying a capacitive load.

The recess defined in the upper ground electrode 230 as shown in FIG. 30 increases the distance between the upper and lower ground electrodes 230, 232, reducing the capacitance in the upper half of the cavity to compensate for an increase in the capacitive impedance in the lower half of the cavity, so that an overall impedance match to $50\Omega$ can be achieved.

The impedance measured when the magnetic sensor 10 into the side-opened TEM cell 204B with its upper ground electrode 230 machined as shown in FIG. 32 has been of a constant value equal to or smaller than $0.5\Omega$.

Figure 31:
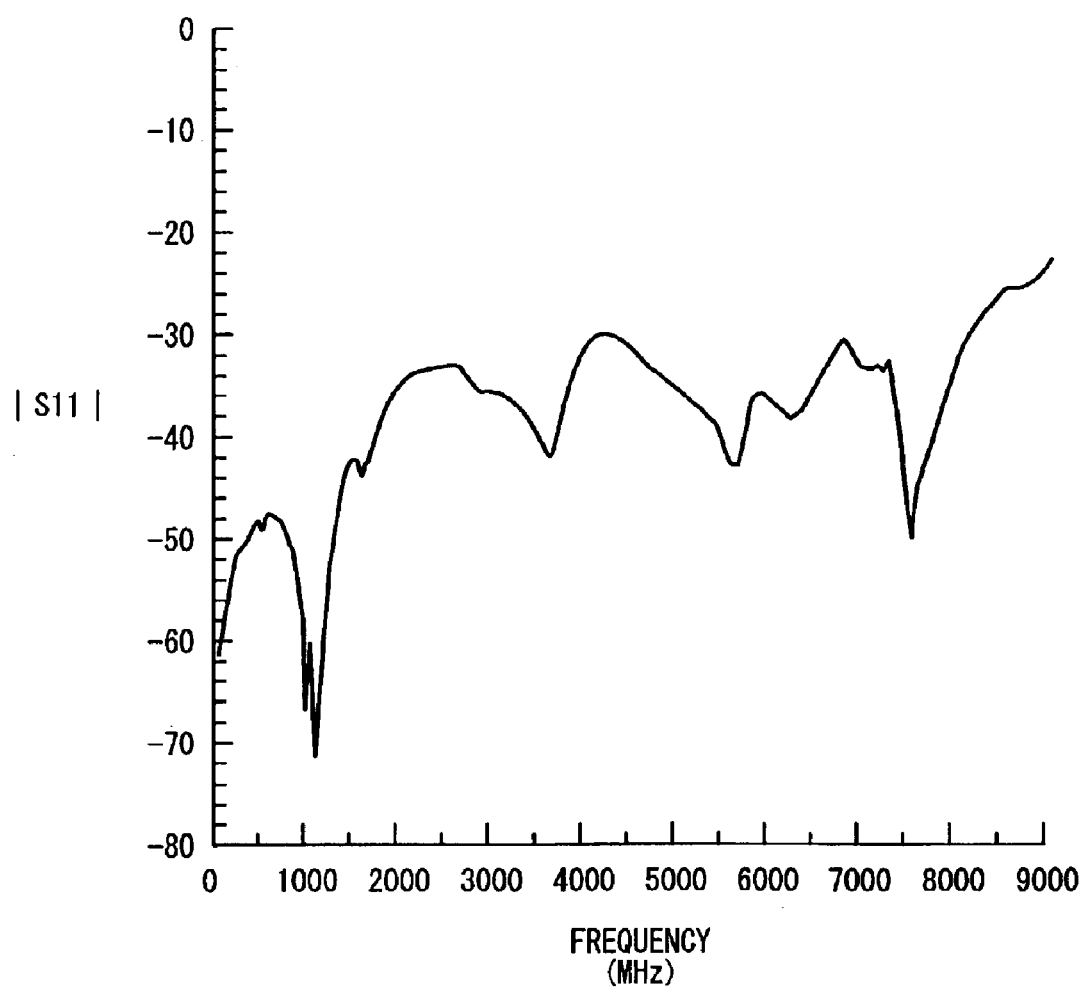
FIG. 31 is a characteristic diagram of a measured input terminal reflection coefficient of the side-opened TEM cell shown in FIG. 30.

FIG. 31 shows measured results of the input end reflection coefficient S11 of the side-opened TEM cell 204B shown in FIG. 30. It is observed from FIG. 32 that the input end reflection coefficient S11 is at most −30 [dB] up to 8 GHz, and is the same as the ideal characteristic curve shown in FIG. 29.

Rather than simply machining the upper ground electrode 230, a cavity may be formed with excessive inductance, and a dielectric block of good high-frequency characteristics, made of polytetrafluoroethylene or the like, may be placed in the cavity near the upper ground electrode 230 to locally adjust the capacitance for improved impedance matching.

It has been found that the above attempt is effective also in compensating for and improving spatially asymmetrical characteristics of an impedance distribution which are caused by the insertion of the magnetic sensor 10 into the cavity.

For measuring permeability with good accuracy, it is important to use a high-frequency magnetic field which is as uniform as possible. Such a high-frequency magnetic field which is as uniform as possible is generated in the central region of the lower half of the cavity in the side-opened TEM cell 204. Electric force lines of a high-frequency electric field are uniformly parallel to each other vertically in that central region of the lower half of the cavity in the side-opened TEM cell 204. The magnetic sensor 10 which is electrically substantially symmetric horizontally operates as an ideal device capable of detecting only a high-frequency magnetic signal, affected minimally by a high-frequency electric field which is uniform.

As shown in FIGS. 24 and 25, the slit opening 206 is defined in the lower ground electrode 232 in the direction in which the electromagnetic wave travels, the slit opening 206 being large enough to receive the shielded loop coil 100 of the magnetic sensor 10 inserted therein. When the shielded loop coil 100 of the magnetic sensor 10 is inserted into the slit opening 206, as shown in FIGS. 23 and 30, it is kept in a low position in which the opening hole 16 is higher than the inner surface of the lower ground electrode 232 and the forward transmission coefficient (coupling gain) S21 from the cell input to the magnetic sensor output is of a value smaller than −10 [dB]. The magnetic sensor 10 thus positioned makes the cavity characteristics of the side-opened TEM cell 204 fairly free of frequency dependency.

When the permeameter 200 shown in FIG. 21 is used, a conductive object which defines an electric spatial boundary (electric boundary), such as the solenoid coil 205 for applying a DC magnetic field, surrounds the side-opened TEM cell 204 in which the magnetic sensor assembly 220 as a high-frequency fixture is inserted.

Reflections from such an electric boundary affect the wave mode in the cavity, tending to make the side-opened TEM cell 204 slightly frequency-dependent. If slight impedance disturbance remains in the vicinity of the input and output ports of the cavity, then the gain or phase may abruptly change at a frequency determined by a reflection electric length difference of the cavity.

Under such conditions, however, as shown in FIG. 23, the shielded loop coil 100 physically placed just at the center of the cavity is effective to cancel the interference between the input and output ports, minimizing errors involved in the measurement of permeability.

FIG. 32 fragmentarily shows a permeameter having radio wave absorbers 300, each made of foamed urethane impregnated with carbon, applied to the inner surface of the solenoid coil 205 which surrounds the side-opened TEM cell 204 with the magnetic sensor assembly 220 inserted therein and applies a DC magnetic field thereto. The radio wave absorbers 300 serve as a means for suppressing electromagnetic waves reflected back into the cavity.

If the radio wave absorbers 300 were not present, then a high-frequency electromagnetic field leaking from the side-opened TEM cell 204 will be reflected by the inner surface of the solenoid coil 205, and return into the cavity of the side-opened TEM cell 204, tending to produce an unwanted resonance mode.

Since resonance gives rise to an abrupt gain or phase change, leading to an unwanted error of measured permeability data compared with a slight change of observing S-parameters.

The radio wave absorbers 300 placed in the solenoid coil 205 reduces strength of an unwanted resonance mode and increases its resonance width, so any error of measured data can greatly be reduced.

The means for suppressing electromagnetic waves reflected back into the cavity is not limited to the radio wave absorbers 300, but may be in the form of a reflection plate disposed outside and closely to the cavity for reflecting a high-frequency radio wave leaking from the cavity opening, or a radio wave interference element for interfering with a high-frequency radio wave leaking from the cavity opening. Such a reflection plate or a radio wave interference element may be able to reduce the strength of a high-frequency electromagnetic field reflected from a boundary outside the cavity into the cavity opening, or disturb the phase of a reflected wave to suppress a resonant transverse mode.

The permeameter 200 which employs the side-opened TEM cell 204 from which any radio wave leakage into the surrounding space is small does not essentially require the above means for suppressing electromagnetic waves reflected back into the cavity. However, the means for suppressing electromagnetic waves reflected back into the cavity is effective for improving the signal to noise ratio of a permeameter more or less.

Of the parts of the side-opened TEM cell 204, the surfaces that make up the cavity should preferably be plated with gold or the like for preventing the electric resistance thereof from changing due to aging. The part of the side-opened TEM cell 204 may be made of brass or any of various other metals including Cu.

The board layers of the magnetic sensor 10 may be made of FR-4, polytetrafluoroethylene, ceramics such as glass, alumina, aluminum nitride, or the like, or a semiinsulating semiconductor material such as GaN, GaAs, InP, or the like, in addition to PPE. While the circuit board including three conductor layers has been illustrated, the circuit board may include four or more conductor layers insofar as it can provide a stripline. The solder used to join parts may be replaced with an electrically conductive adhesive.

In the above embodiments, SMA connectors have been illustrated as high-frequency connectors. However, different types of coaxial high-frequency connectors including N-type connectors, K connectors, V connectors, 3.5-mm connectors, etc. may also be used as high-frequency connectors. While high-frequency coaxial connectors of the panel mount type have been illustrated, different types of joining processes such as soldering, screw mounting, etc. may be used to join high-frequency coaxial connectors to ground electrodes.

According to the present invention, as described above, a shielded-loop-coil type magnetic sensor having high-frequency characteristics much higher than conventional magnetic sensors can easily be fabricated.

According to the present invention, furthermore, it is possible to provide a structure (side-opened TEM cell cavity) which has a cavity the interior of which can easily be accessed from outside the cavity, and which can generate a uniform high-frequency magnetic field (having a constant value and parallel magnetic lines of force) regardless of the frequency in a certain spatial volume.

According to the present invention, moreover, it is possible to realize a permeameter capable of measuring permeability in a frequency range up to super frequencies.

Although certain preferred embodiments of the present invention have been shown and described in detail, it should be understood that various changes and modifications may be made therein without departing from the scope of the appended claims.

What is claimed is:

1. A magnetic sensor comprising a multilayer circuit board with a triplate stripline, comprising:
   said multilayer circuit board having a first surface conductor layer, a second surface conductor layer, and an inner conductor layer;
   said first surface conductor layer and said second surface conductor layer having respective one-turn looped ground patterns, and respective ground lead patterns connected respectively to said one-turn looped ground patterns;
   said one-turn looped ground patterns having respective gaps;
   said inner conductor layer having a substantially C-shaped signal line sandwiched between said one-turn looped ground patterns and serving as a central conductor of the stripline, and a signal lead line sandwiched between said ground lead patterns and serving as the central conductor of the stripline;
   said substantially C-shaped signal line extending across said gaps;
   said substantially C-shaped signal line being connected through a via to said one-turn looped ground patterns;
   the arrangement being such that if said one-turn looped ground patterns have an inductance L and a capacitor composed between both electrodes provided by ends of said one-turn looped ground patterns which face each other across said gap, one of said ends including said via as an electrode, has a capacitance C, then the product L×C of said inductance L and the capacitance C is $2.5 \times 10^{-20}$ or less and the maximum outer circumference length of said one-turn looped ground patterns is 50 [mm] or less.

2. A magnetic sensor according to claim 1, wherein an opening hole extending through said multilayer circuit board is positioned inside said one-turn looped ground patterns.

3. A magnetic sensor according to claim 1, further comprising a plurality of vias interconnecting said one-turn looped ground pattern of said first surface conductor layer and said one-turn looped ground pattern of said second surface conductor layer and/or said ground lead pattern of said first surface conductor layer and said ground lead pattern of said second surface conductor layer.

4. A magnetic sensor according to claim 3, further comprising shielding ground conductor lines extending along said substantially C-shaped signal line of said inner conductor layer and connected to said vias, and shielding ground conductor lines extending along said signal lead line of said inner conductor layer and connected to said vias.

5. A permeameter comprising a cavity of a parallel transmission line structure having an impedance of 50Ω for generating a high-frequency magnetic field therein parallel to said parallel transmission line structure in response to a high-frequency signal applied to an end of said cavity, said cavity having an opposite end short-terminated or impedance-matched by a terminal resistor, a magnetic sensor according to claim 2 which is placed in said high-frequency magnetic field with said opening being directed perpendicularly to said high-frequency magnetic field and said gap facing a high-frequency signal transmission line of said parallel transmission line, said opening hole accommodating a magnetic specimen horizontally inserted therein, the arrangement being such that an induced voltage of said magnetic sensor and an impedance of said magnetic sensor are measured when said magnetic specimen is magnetically saturated and when said magnetic specimen is magnetically unsaturated, for thereby measuring a complex permeability of said magnetic specimen.

6. A permeameter according to claim 5, wherein a side-opened TEM cell is used as the cavity of the parallel transmission line structure having the impedance of 50Ω, wherein said side-opened TEM cell comprises a high-frequency cavity ground body which comprises upper and lower ground electrodes and longitudinally opposite end ground electrodes which are machined from a conductor in the shape of a rectangular parallelepiped, leaving a cavity having a horizontally elongate octagonal cross-sectional shape with four corners beveled vertically from longitudinal sides thereof, first and second high-frequency coaxial connectors mounted centrally on said end ground electrodes and having respective central pins having respective confronting electrodes, a high-frequency signal electrode disposed between the confronting electrodes of said central pins parallel to said upper and lower ground electrodes, said high-frequency signal electrode comprising a plate in the shape of a horizontally elongate octagonal shape with four corners beveled, said plate having a width equal to or narrower than 0.7 times the width of said the upper and lower ground electrodes, said high-frequency signal electrode and said upper and lower ground electrodes jointly making up a triplate transmission line between said first and second high-frequency coaxial connectors, said high-frequency signal electrode having attachment end faces joined to the central pins of said high-frequency coaxial connectors, said attachment end faces having a width equal to or narrow more than three times the thickness of said high-frequency signal electrode to maintain the impedance of 50Ω over the full length of the triplate transmission line, and wherein said second high-frequency coaxial connector is terminated with 50Ω.

7. A permeameter according to claim 6, wherein a surface of said upper ground electrode which faces said high-frequency signal electrode is machined to expand an upper half space defined between said high-frequency signal electrode and said upper ground electrode to match the impedance of parts in a transmission direction of said side-opened TEM cell to 50Ω when said magnetic sensor is placed in a lower half space defined between said high-frequency signal electrode and said lower ground electrode.

8. A permeameter according to claim 6, wherein said lower ground electrode of said side-opened TEM cell has a slit opening and extending in a direction in which an electromagnetic wave travels, said slit opening receiving said one-turn looped ground patterns which function as a sensor head, of said magnetic sensor according to claim 2, said one-turn looped ground patterns being inserted in a lower half space defined between said high-frequency signal electrode and said lower ground electrode through said slit opening at such a position that a forward transmission coefficient from said first high-frequency coaxial connector to said magnetic sensor is of a value smaller than −10 dB.

9. A permeameter according to claim 5, further comprising a radio wave suppressor disposed near said cavity for reflecting, interfering with, or absorbing a high-frequency electromagnetic wave which leaks from an opening of said cavity of the parallel transmission line structure having the impedance of 50Ω.

* * * * *